(12) United States Patent
Ozawa et al.

(10) Patent No.: US 9,275,947 B2
(45) Date of Patent: Mar. 1, 2016

(54) SEMICONDUCTOR DEVICE AND SEMICONDUCTOR PACKAGE HAVING A PLURALITY OF DIFFERENTIAL SIGNAL BALLS

(71) Applicant: KABUSHIKI KAISHA TOSHIBA, Tokyo (JP)

(72) Inventors: Isao Ozawa, Kanagawa (JP); Isao Maeda, Kanagawa (JP); Yasuo Kudo, Tokyo (JP); Koichi Nagai, Tokyo (JP); Katsuya Murakami, Tokyo (JP); Akira Tanimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/190,775

(22) Filed: Feb. 26, 2014

(65) Prior Publication Data

US 2015/0137363 A1 May 21, 2015

(30) Foreign Application Priority Data

Nov. 20, 2013 (JP) .................................. 2013-240238

(51) Int. Cl.
*H01L 23/00* (2006.01)
*H01L 23/50* (2006.01)
(Continued)

(52) U.S. Cl.
CPC .......... *H01L 23/50* (2013.01); *H01L 23/49838* (2013.01); *H01L 25/0652* (2013.01); *H01L 25/0657* (2013.01); *H01L 23/3128* (2013.01); *H01L 23/3135* (2013.01); *H01L 23/367* (2013.01); *H01L 23/66* (2013.01); *H01L 24/32* (2013.01); *H01L 24/48* (2013.01); *H01L 24/73* (2013.01); *H01L 25/18* (2013.01); *H01L 2223/6638* (2013.01); *H01L 2224/04042* (2013.01); *H01L 2224/06135* (2013.01); *H01L 2224/06136* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01);
(Continued)

(58) Field of Classification Search
CPC ..... H01L 24/14; H01L 23/00; H01L 2924/00; H01L 224/48227; H01L 224/73265; H01L 224/32225; H01L 2924/15311
USPC ......... 257/686, 777, 723, 685, 778, 737, 738, 257/734
See application file for complete search history.

(56) References Cited

U.S. PATENT DOCUMENTS 6,150,724 A * 11/2000 Wenzel et al. ................ 257/777
9,042,115 B2 * 5/2015 Kwon et al. .................. 361/790

(Continued)

FOREIGN PATENT DOCUMENTS

JP 2013-200595 A 10/2013

*Primary Examiner* — Alexander Oscar Williams
(74) *Attorney, Agent, or Firm* — Patterson & Sheridan, LLP

(57) ABSTRACT

A semiconductor device includes a substrate, a sealing portion, a controller, a semiconductor chip, and a plurality of differential signal balls. The substrate has a first surface and a second surface positioned on a side opposite to the first surface. The sealing portion is formed on the first surface of the substrate. The controller is covered with the sealing portion. The semiconductor chip is electrically connected to the controller, and is covered with the sealing portion. The plurality of differential signal balls are formed on the second surface of the substrate. At least some of the plurality of differential signal balls are arranged substantially parallel to one side of the substrate.

12 Claims, 18 Drawing Sheets

(51) Int. Cl.
  *H01L 23/498* (2006.01)
  *H01L 25/065* (2006.01)
  *H01L 23/367* (2006.01)
  *H01L 23/31* (2006.01)
  *H01L 23/66* (2006.01)
  *H01L 25/18* (2006.01)

(52) U.S. Cl.
  CPC ............... *H01L 2224/83191* (2013.01); *H01L 2225/0651* (2013.01); *H01L 2225/06506* (2013.01); *H01L 2225/06562* (2013.01); *H01L 2924/00014* (2013.01); *H01L 2924/15311* (2013.01); *H01L 2924/3025* (2013.01); *H01L 2924/351* (2013.01)

(56) References Cited

U.S. PATENT DOCUMENTS

| | | | |
|---|---|---|---|
| 2004/0071040 A1* | 4/2004 | Funaba | G11C 5/04 365/232 |
| 2005/0139977 A1* | 6/2005 | Nishio et al. | 257/686 |
| 2006/0192282 A1* | 8/2006 | Suwa | H01L 23/50 257/723 |
| 2007/0192559 A1* | 8/2007 | Betsui | G11C 5/04 711/167 |
| 2008/0093726 A1* | 4/2008 | Preda et al. | 257/700 |
| 2008/0237848 A1* | 10/2008 | Yoshikawa et al. | 257/723 |
| 2008/0266031 A1* | 10/2008 | Uematsu | H01L 23/49838 333/247 |
| 2010/0038117 A1* | 2/2010 | Chung et al. | 174/254 |
| 2010/0087096 A1* | 4/2010 | Sloey | H01R 13/405 439/607.01 |
| 2010/0213611 A1* | 8/2010 | Isa et al. | 257/738 |
| 2012/0068229 A1* | 3/2012 | Bemanian et al. | 257/209 |
| 2013/0108065 A1* | 5/2013 | Mullins | G01R 31/31701 381/58 |
| 2014/0070428 A1* | 3/2014 | Tanimoto et al. | 257/777 |
| 2014/0264812 A1* | 9/2014 | Chang | H01L 25/0657 257/686 |
| 2014/0270629 A1* | 9/2014 | Dutt et al. | 385/14 |
| 2015/0130059 A1* | 5/2015 | Ozawa | H01L 23/49838 257/738 |
| 2015/0200008 A1* | 7/2015 | Ozawa | G11C 14/0018 365/185.08 |

* cited by examiner

FIG. 9

| NAME OF BALL | CONTENTS |
|---|---|
| PERp (0) | FIRST SET OF PCIe HIGH SPEED DIFFERENTIAL SIGNALS (INPUT) |
| PERn (0) | FIRST SET OF PCIe HIGH SPEED DIFFERENTIAL SIGNALS (INPUT) |
| PETp (0) | FIRST SET OF PCIe HIGH SPEED DIFFERENTIAL SIGNALS (OUTPUT) |
| PETn (0) | FIRST SET OF PCIe HIGH SPEED DIFFERENTIAL SIGNALS (OUTPUT) |
| PERp (1) | SECOND SET OF PCIe HIGH SPEED DIFFERENTIAL SIGNALS (INPUT) |
| PERn (1) | SECOND SET OF PCIe HIGH SPEED DIFFERENTIAL SIGNALS (INPUT) |
| PETp (1) | SECOND SET OF PCIe HIGH SPEED DIFFERENTIAL SIGNALS (OUTPUT) |
| PETn (1) | SECOND SET OF PCIe HIGH SPEED DIFFERENTIAL SIGNALS (OUTPUT) |
| PERp (2) | THIRD SET OF PCIe HIGH SPEED DIFFERENTIAL SIGNALS (INPUT) |
| PERn (2) | THIRD SET OF PCIe HIGH SPEED DIFFERENTIAL SIGNALS (INPUT) |
| PETp (2) | THIRD SET OF PCIe HIGH SPEED DIFFERENTIAL SIGNALS (OUTPUT) |
| PETn (2) | THIRD SET OF PCIe HIGH SPEED DIFFERENTIAL SIGNALS (OUTPUT) |
| PERp (3) | FOURTH SET OF PCIe HIGH SPEED DIFFERENTIAL SIGNALS (INPUT) |
| PERn (3) | FOURTH SET OF PCIe HIGH SPEED DIFFERENTIAL SIGNALS (INPUT) |
| PETp (3) | FOURTH SET OF PCIe HIGH SPEED DIFFERENTIAL SIGNALS (OUTPUT) |
| PETn (3) | FOURTH SET OF PCIe HIGH SPEED DIFFERENTIAL SIGNALS (OUTPUT) |

SEMICONDUCTOR DEVICE AND SEMICONDUCTOR PACKAGE HAVING A PLURALITY OF DIFFERENTIAL SIGNAL BALLS

CROSS-REFERENCE TO RELATED APPLICATION

This application is based upon and claims the benefit of priority from Japanese Patent Application No. 2013-240238, filed Nov. 20, 2013, the entire contents of which are incorporated herein by reference.

FIELD

An embodiment described herein relates to a semiconductor device which includes a semiconductor package.

BACKGROUND

A semiconductor device which includes a semiconductor memory chip is known, and an enhancement in high speed operability of such a semiconductor device is in demand.

DESCRIPTION OF THE DRAWINGS

FIG. 9 is a view illustrating the contents of the assignment shown in FIG. 8.

DETAILED DESCRIPTION

Figure 1:
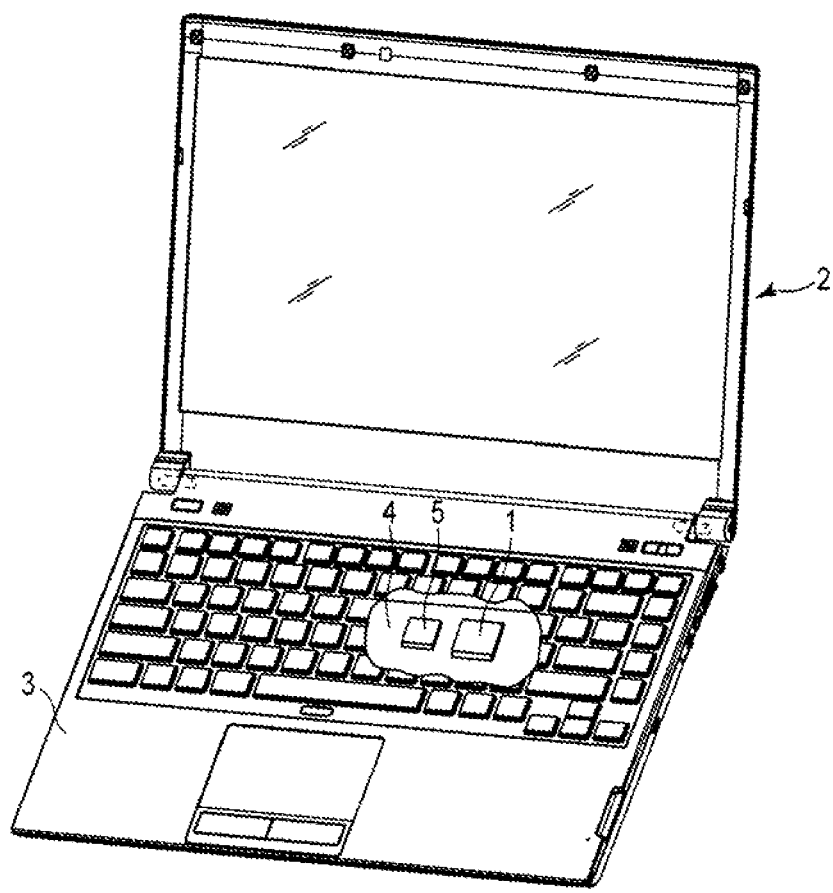
FIG. 1 is a perspective view illustrating electronic equipment according to a first embodiment.

According to an embodiment, there is provided a semiconductor device and a semiconductor package which may enhance high speed operability thereof.

In general, according to one embodiment, a semiconductor device includes: a substrate; a sealing portion; a controller; a semiconductor chip; and a plurality of differential signal balls. The substrate has a first surface and a second surface positioned on a side opposite to the first surface. The sealing portion is formed on the first surface of the substrate. The controller is covered with the sealing portion. The semiconductor chip is electrically connected to the controller, and is covered with the sealing portion. The plurality of differential signal balls are formed on the second surface of the substrate. At least some of the plurality of differential signal balls are arranged substantially parallel to one side of the substrate.

Exemplary embodiments are explained with reference to the drawings.

In this disclosure, a plurality of expressions may be used to describe the same element. However, the expressions are only examples, and it should be understood that the same element may be expressed using other expressions. Further, any of the elements of the present disclosure, whether they are expressed using plural expressions or not, may be expressed using other expressions.

A semiconductor device and a semiconductor package are schematically shown in the drawings and hence, the relationship between thicknesses and planar sizes, ratio between thicknesses of respective layers and the like differ from those of an actual semiconductor device and an actual semiconductor package. Further, there may be cases where the drawings illustrate parts whose size relationship or size ratio differs between drawings.

First Embodiment

FIG. 1 to FIG. 10 show a semiconductor package 1 according to the first embodiment. The semiconductor package 1 is one example of a "semiconductor device" or one example of a "semiconductor memory device". The semiconductor package 1 according to this embodiment is a so-called BGA-SSD (Ball Grid Array-Solid State Drive) where a plurality of semiconductor memory chips and a controller are integrally formed as one BGA-type package.

FIG. 1 shows one example of electronic equipment 2 in which the semiconductor package 1 is mounted. The electronic equipment 2 is one example of a "system", a "device" or a "unit". The electronic equipment 2 includes a casing 3 and a printed circuit board 4 (main board, for example) which is accommodated in the casing 3. The semiconductor package 1 is mounted on the printed circuit board 4, and functions as a storage device of the electronic equipment 2. The printed circuit board 4 includes a host controller 5 (CPU, for example). The host controller 5 includes a southbridge, for example, and controls the entire operation of the electronic equipment 2 which includes the semiconductor package 1.

Figure 2:
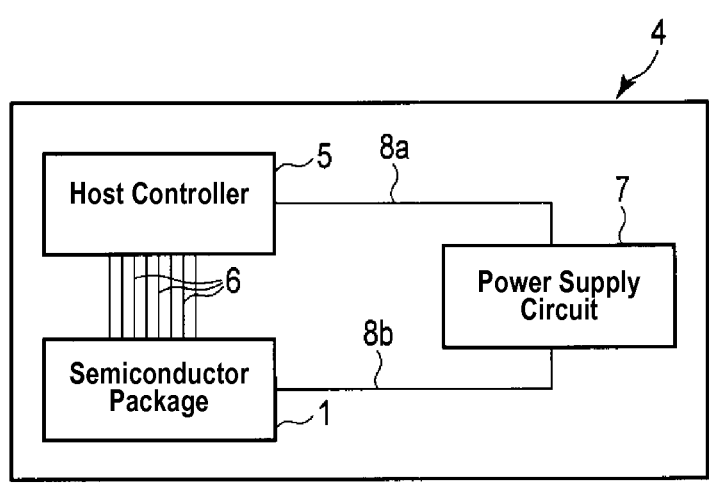
FIG. 2 is a block diagram illustrating a part of a printed circuit board shown in FIG. 1.

FIG. 2 schematically shows a part of the printed circuit board 4. The host controller 5 and the semiconductor package 1 according to this embodiment include an interface which conforms to a standard of PCI Express (hereinafter, PCIe). A plurality of signal lines 6 are arranged between the host controller 5 and the semiconductor package 1. The semiconductor package 1 performs transmission and reception of high speed signals which conform to the PCIe standard, with the host controller 5 through the signal lines 6.

A power supply circuit 7 is mounted on the printed circuit board 4. The power supply circuit 7 is connected to the host controller 5 and the semiconductor package 1 through power supply lines 8a, 8b. The power supply circuit 7 supplies various kinds of power supplies for operating the electronic equipment 2 to the host controller 5 and the semiconductor package 1.

Next, the configuration of the semiconductor package 1 is explained.

Figure 3:
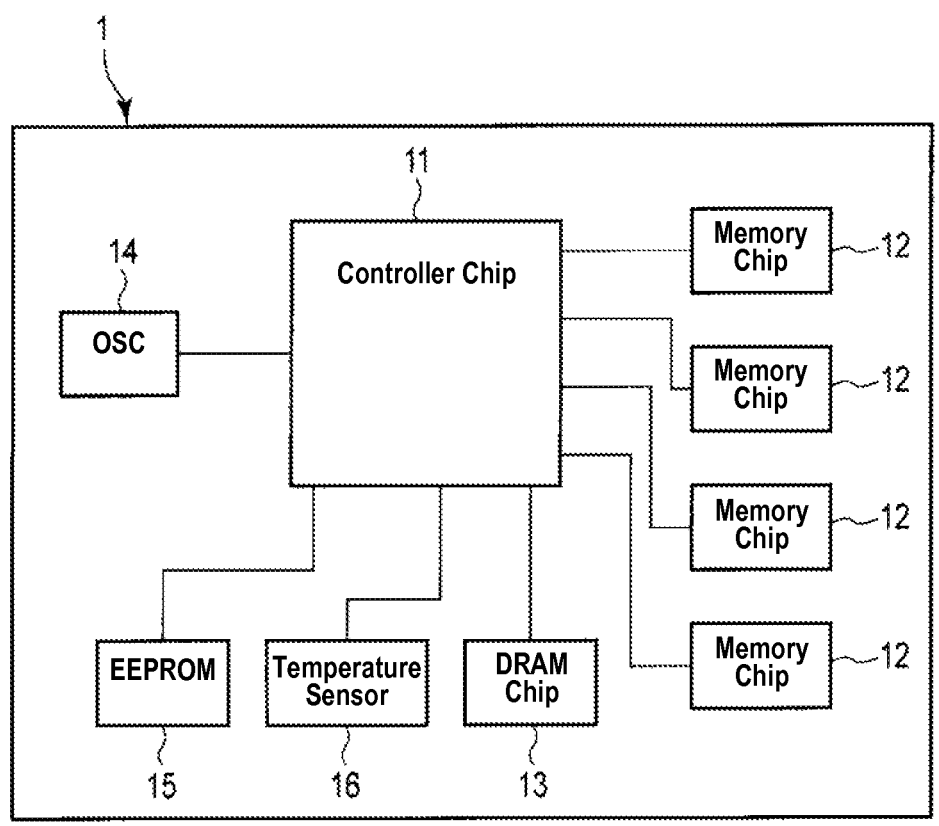
FIG. 3 is a block diagram illustrating a semiconductor package shown in FIG. 1.

FIG. 3 is a block diagram showing one example configuration of the semiconductor package 1. The semiconductor package 1 includes: a controller chip 11; semiconductor memory chips 12; a DRAM chip 13; an oscillator (OSC) 14; an electrically erasable and programmable ROM (EEPROM) 15; and a temperature sensor 16.

The controller chip 11 (that is, a controller) is a semiconductor chip which controls the operation of the semiconductor memory chips 12. The semiconductor memory chip 12 is a NAND chip (NAND flash memory), for example. The NAND chip is a non-volatile memory, and holds data even in a state where a power supply is not supplied to the NAND chip. The DRAM chip 13 is used for storing management information on the semiconductor memory chip 12 or for caching data.

The oscillator (OSC) 14 supplies an operation signal having a predetermined frequency to the controller chip 11. The EEPROM 15 stores a control program or the like therein as fixed information. The EEPROM 15 is one example of a non-volatile memory. The temperature sensor 16 detects the temperature inside of the semiconductor package 1, and informs the controller chip 11 of the temperature.

The controller chip 11 controls the operations of respective parts of the semiconductor package 1 using the temperature information received from the temperature sensor 16. For example, when temperature detected by the temperature sensor 16 is equal to or above predetermined temperature, the controller chip 11 lowers an operation speed of the semiconductor package 1 or stops the operation of the semiconductor package 1 for a predetermined time or at predetermined intervals, thus suppressing the temperature of the semiconductor package 1 to a value equal to or below an allowable value.

Next, the structure of the semiconductor package 1 is explained.

Figure 4:
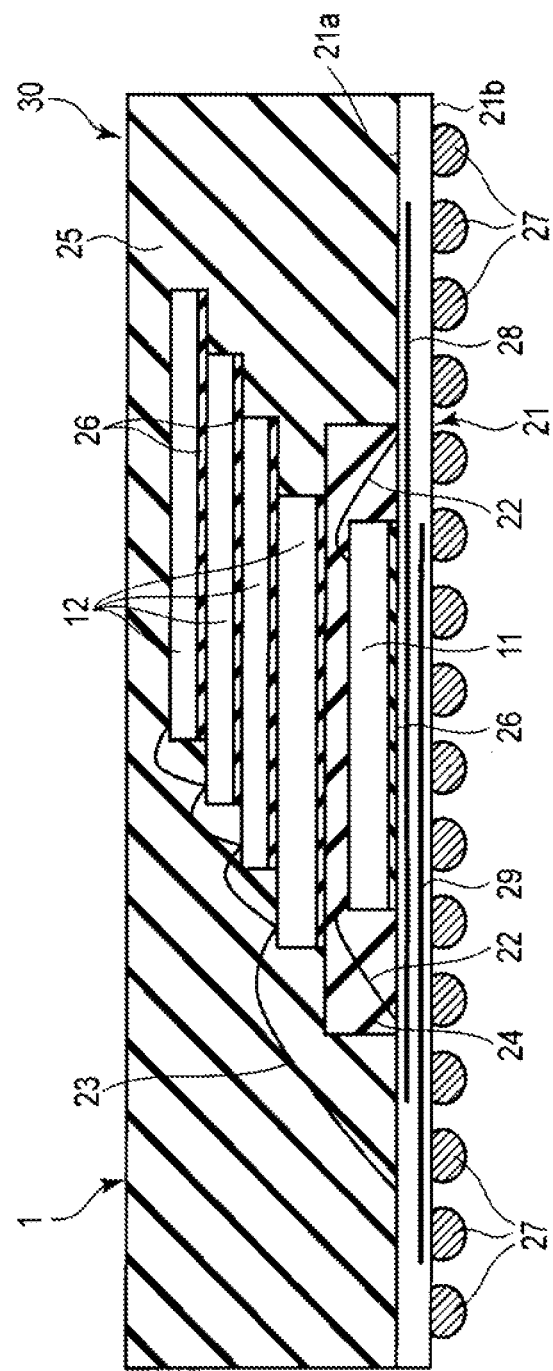
FIG. 4 is a cross-sectional view illustrating the semiconductor package shown in FIG. 1.

FIG. 4 is a cross-sectional view of the semiconductor package 1. The semiconductor package 1 includes: a substrate (package substrate); the controller chip 11; the semiconductor memory chips 12; bonding wires 22, 23; molding materials 24, 25; mounting films 26; and a plurality of solder balls 27.

The substrate 21 is a multilayered printed circuit board, and includes a power supply layer 28 and a ground layer 29. The substrate 21 has a first surface 21a and a second surface 21b which is positioned on a side opposite to the first surface 21a. The controller chip 11 is mounted on the first surface 21a of the substrate 21. The controller chip 11 is fixed to the substrate 21 by the mounting films 26, for example. The controller chip 11 is electrically connected to the substrate 21 by the bonding wires 22.

The first molding material 24 which seals the controller chip 11 and the bonding wires 22 is formed on the first surface 21a of the substrate 21. A mounting film having a large film thickness may be used in place of the first molding material 24. A mold-type semiconductor package (first mold package) in which the controller chip 11 is sealed is formed as described above.

As shown in FIG. 4, the plurality of semiconductor memory chips 12 are laminated on the first molding material 24. The plurality of semiconductor memory chips 12 are fixed to the first molding material 24 by the mounting films 26. The plurality of semiconductor memory chips 12 are electrically connected to the substrate 21 through the bonding wire 23. The semiconductor memory chips 12 are electrically connected to the controller chip 11 through the substrate 21.

On the first surface 21a of the substrate 21, the first molding material 24, and a second molding material 25 which seals the plurality of semiconductor memory chips 12 and the bonding wire 23 are mounted. As described above, in this embodiment, a sealing portion 30 formed on the first surface 21a of the substrate 21 is formed of the first molding material 24 and the second molding material 25. The sealing portion 30 integrally covers the controller chip 11, the plurality of semiconductor memory chips 12, the oscillator 14, the EEPROM 15, and the temperature sensor 16.

Figure 5:
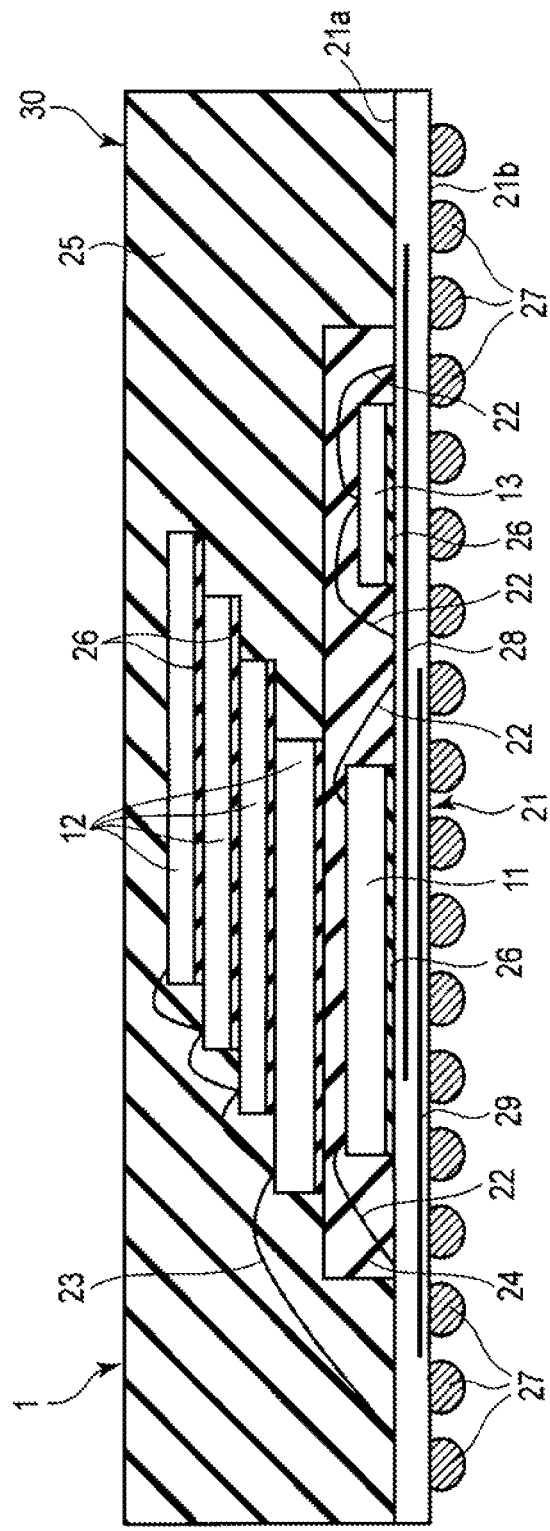
FIG. 5 is a cross-sectional view illustrating a first modification of the semiconductor package shown in FIG. 1.

FIG. 5 shows a first modification of the semiconductor package 1 according to this embodiment. In the first modification, a DRAM chip 13 is mounted on the first surface 21a of a substrate 21. The DRAM chip 13 is covered with a first molding material 24. The DRAM chip 13 may be positioned outside the first molding material 24, and may be covered with a second molding material 25.

Figure 6:
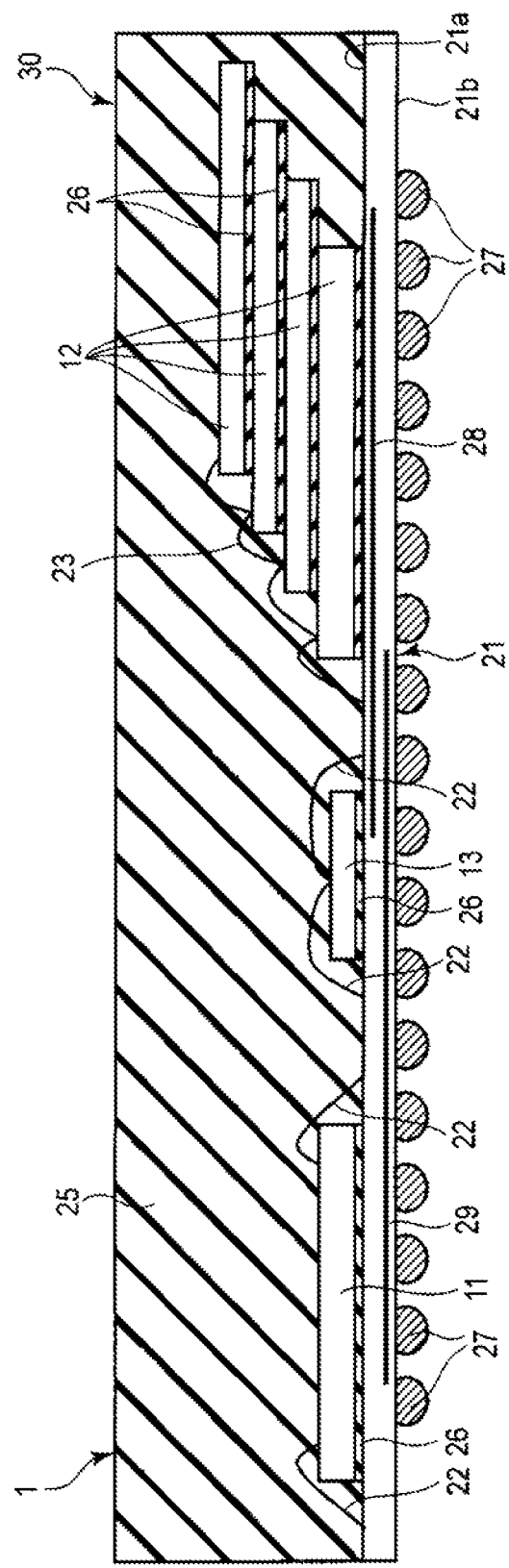
FIG. 6 is a cross-sectional view illustrating a second modification of the semiconductor package shown in FIG. 1.

FIG. 6 shows a second modification of the semiconductor package 1 according to this embodiment. In the second modification, a plurality of semiconductor memory chips 12 are laminated on a first surface 21a of a substrate 21. That is, the plurality of semiconductor memory chips 12 are arranged on a side of a controller chip 11 and a DRAM chip 13.

In this modification, one molding material 25 covers the controller chip 11, the DRAM chip 13, and the plurality of semiconductor memory chips 12 integrally. In this case, a sealing portion 30 formed on the first surface 21a of the substrate 21 is formed by one molding material 25. The sealing portion 30 of the semiconductor package 1 is not limited to a sealing portion made of a molding material, and the sealing portion 30 may be made of a ceramic material or other materials.

Next, the plurality of solder balls 27 formed on the substrate 21 are explained.

As shown in FIG. 4, the plurality of solder balls 27 for external connection are formed on the second surface 21b of the substrate 21. In this embodiment, the solder balls 27 are arranged at a pitch of 0.5 mm, for example.

Figure 7:
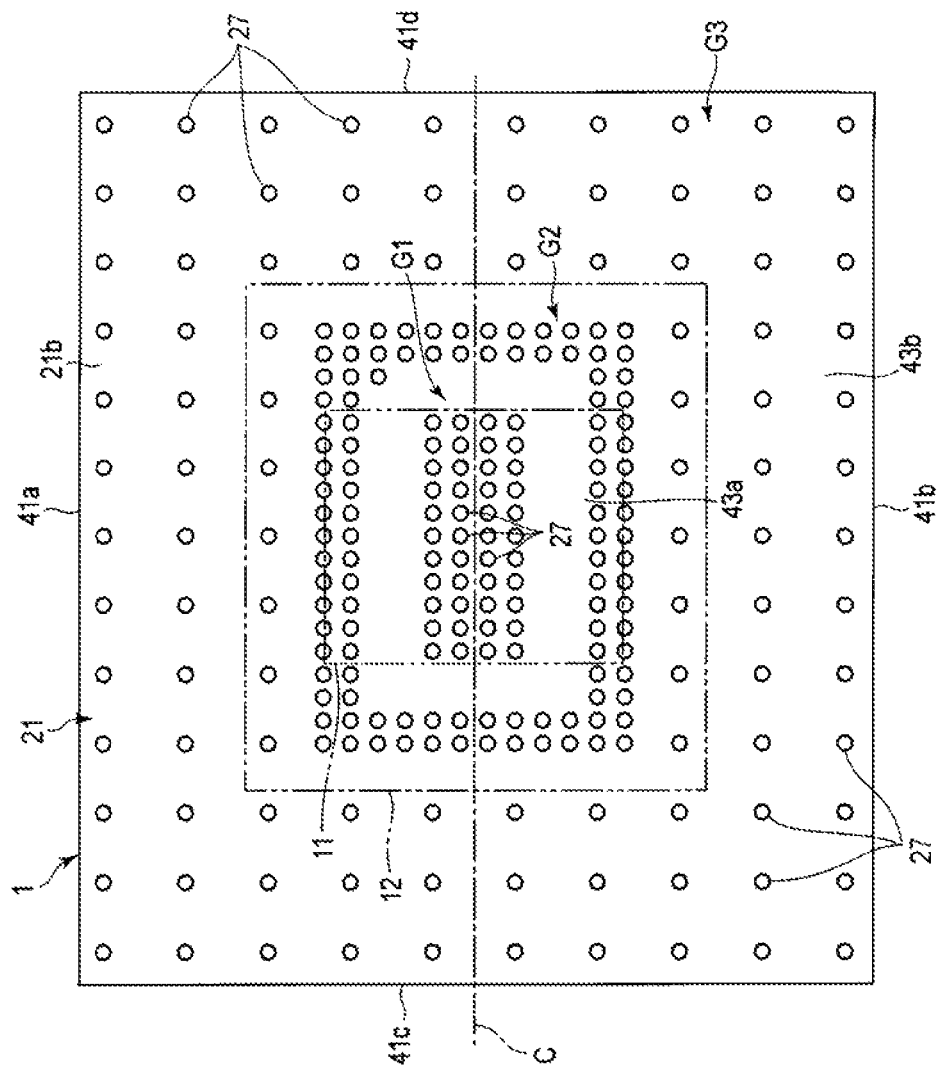
FIG. 7 is a bottom plan view illustrating a lower surface of the semiconductor package shown in FIG. 1.

FIG. 7 shows the arrangement of the solder balls 27 on the second surface 21b of the substrate 21. As shown in FIG. 7, the plurality of solder balls 27 are not arranged on the entire second surface 21b of the substrate 21 in a matted manner but are arranged partially on the second surface 21b of the substrate 21.

Figure 8:
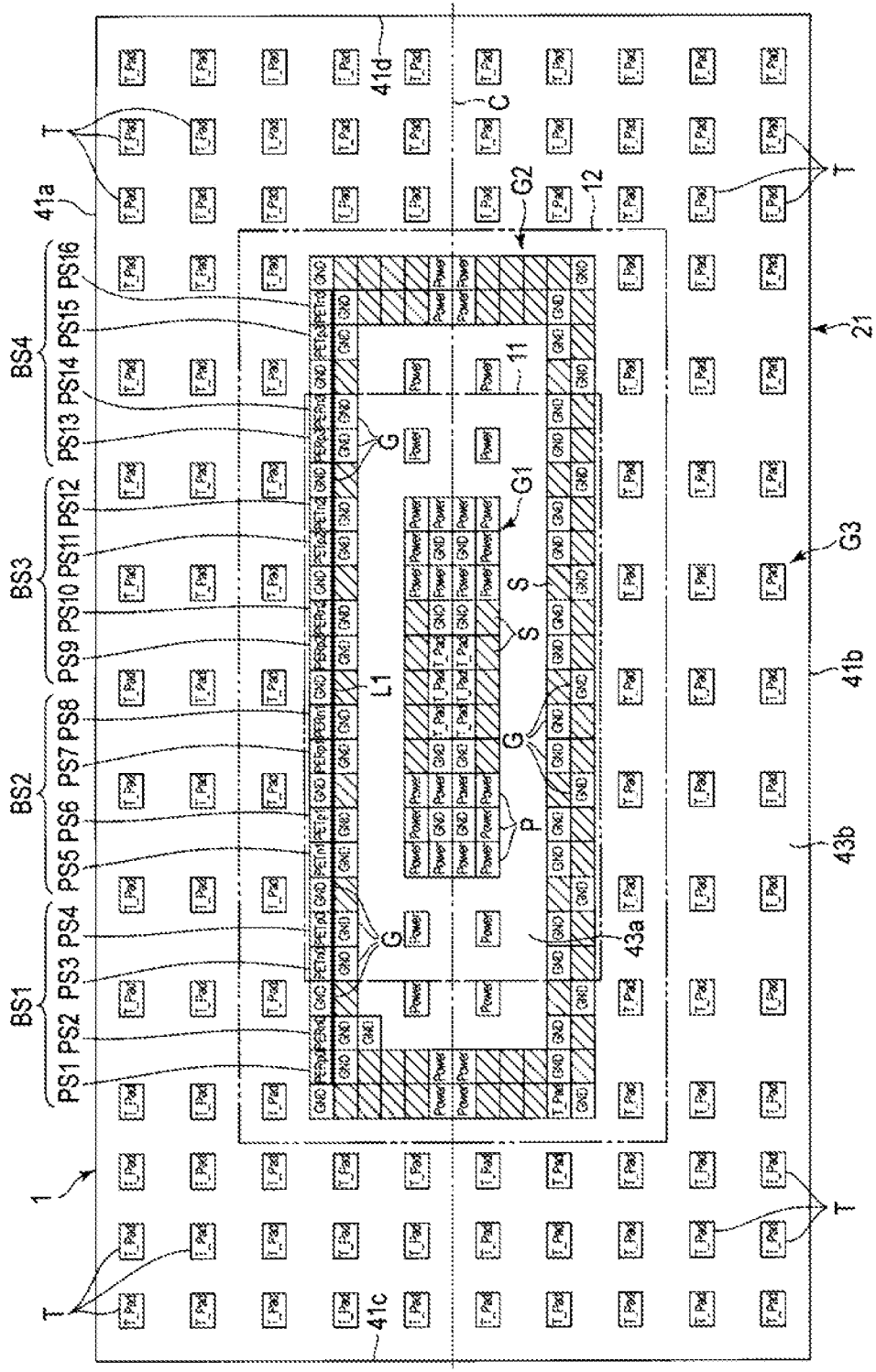
FIG. 8 is a view illustrating the assignment of solder balls shown in FIG. 7.
Figure 10:
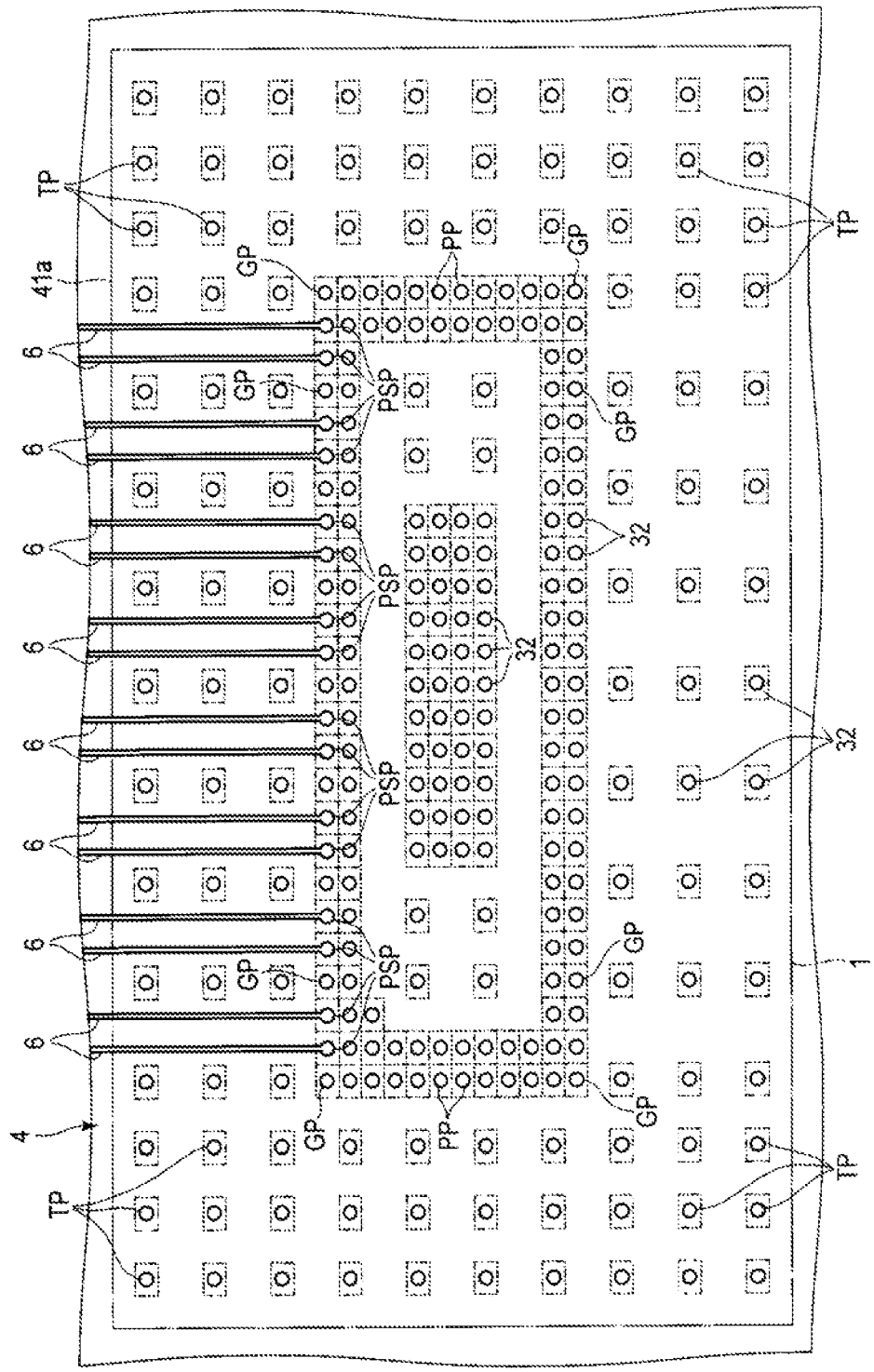
FIG. 10 is a plan view illustrating pads of the printed circuit board according to the first embodiment.

FIG. 8 schematically shows the assignment of the solder balls 27. To simplify the description, FIG. 8 shows the ball arrangement with reference to the posture of the solder balls 27 mounted on the printed circuit board 4 (that is, with reference to the posture of the solder balls 27 as viewed in a plan view of the semiconductor package 1). FIG. 9 shows the contents of the assignment shown in FIG. 8. FIG. 10 shows pads 32 on the printed circuit board 4 to which the solder balls 27 are connected.

The plurality of solder balls 27 according to this embodiment include PCIe signal balls PS1 to PS16, other signal balls S, power supply balls P, ground balls G, and thermal balls T (heat radiation balls). The PCIe signal balls PS1 to PS16 are one example of "differential signal balls".

In FIG. 8, the signal balls S are indicated by hatching, power supply balls P are indicated by "Power", the ground balls G are indicated by "GND", and the thermal balls T are indicated by "T_pad". Hereinafter, the arrangement of the solder balls 27 is explained in detail.

As shown in FIG. 8, the plurality of solder balls 27 are arranged such that the solder balls 27 are divided into a first group G1, a second group G2, and a third group G3. The first group G1 is positioned at a center portion of the substrate 21. The first group G1 includes the plurality of thermal balls T arranged on the center portion of the substrate 21, and the plurality of power supply balls P, the ground balls G and the signal balls S, which are arranged so as to surround the plurality of thermal balls T.

The thermal balls T (heat radiation balls) are electrically connected to the ground layer 29 or the power supply layer 28 of the substrate 21 (that is, a copper layer). Accordingly, heat generated in the controller chip 11 or the like is easily transferred to the thermal balls T through the ground layer 29 or the power supply layer 28.

The thermal balls T release some of the heat of the semiconductor package 1 to the printed circuit board 4. For example, in this embodiment, the controller chip 11 is positioned at the center portion of the substrate 21, and overlaps with the thermal balls T in the first group G1. The controller chip 11 generates a large quantity of heat during operation, as compared to other parts (the semiconductor memory chip 12 or the DRAM chip 13, for example). The thermal balls T in the first group G1 release some of the heat transferred to the substrate 21 from the controller chip 11 to the printed circuit board 4.

The power supply balls P are electrically connected to the power supply layer 28 of the substrate 21 so that various kinds of power supplies are supplied to the semiconductor package 1. The ground balls G are electrically connected to the ground layer 29 of the substrate 21, and have a ground potential.

As shown in FIG. 8, the second group G2 is arranged in a frame shape which surrounds the first group G1. A gap is formed between the second group G2 and the first group G1. The second group G2 includes: the PCIe signal balls PS1 to PS16; the signal balls S; the power supply balls P; and the ground balls G.

Here, the PCIe signal balls PS1 to PS16 are explained in detail. As shown in FIG. 8 and FIG. 9, the first PCIe signal ball PS1 corresponds to a first set of PCIe high speed differential signals (input, positive). The second PCIe signal ball PS2 corresponds to a first set of PCIe high speed differential signals (input, negative). The first and second PCIe signal balls PS1, PS2 constitute a differential pair through which a first differential signal flows.

The third PCIe signal ball PS3 corresponds to a first set of PCIe high speed differential signals (output negative). The fourth PCIe signal ball PS4 corresponds to a first set of PCIe high speed differential signals (output positive). The third and fourth PCIe signal balls PS3, PS4 constitute a differential pair through which a second differential signal flows.

The four PCIe signal balls PS1, PS2, PS3, PS4 constitute a first solder ball set BS1 (that is, a first lane) which corresponds to a first signal set that includes a pair of high speed differential input signals and high speed differential output signals.

In the same manner, the fifth PCIe signal ball PS5 corresponds to a second set of PCIe high speed differential signals (output negative). The sixth PCIe signal ball PS6 corresponds to a second set of PCIe high speed differential signals (output positive). The fifth and sixth PCIe signal balls PS5, PS6 constitute a differential pair through which a third differential signal flows.

The seventh PCIe signal ball PS7 corresponds to a second set of PCIe high speed differential signals (input, positive). The eighth PCIe signal ball PS8 corresponds to a second set of PCIe high speed differential signals (input, negative). The seventh and eighth PCIe signal balls PS7, PS8 constitute a differential pair through which a fourth differential signal flows.

The four PCIe signal balls PS5, PS6, PS7, PS8 constitute a second solder ball set BS2 (that is, a second lane) which corresponds to a second signal set that includes a pair of high speed differential input signals and high speed differential output signals.

The ninth PCIe signal ball PS9 corresponds to a third set of PCIe high speed differential signals (input, positive). The tenth PCIe signal ball PS10 corresponds to a third set of PCIe high speed differential signals (input, negative). The ninth and tenth PCIe signal balls PS9, PS10 constitute a differential pair through which a fifth differential signal flows.

The eleventh PCIe signal ball PS11 corresponds to a third set of PCIe high speed differential signals (output, positive). The twelfth PCIe signal ball PS12 corresponds to a third set of PCIe high speed differential signals (output, negative). The eleventh and twelfth PCIe signal balls PS11, PS12 constitute a differential pair through which a sixth differential signal flows.

The four PCIe signal balls PS9, PS10, PS11, PS12 constitute a third solder ball set BS3 (that is, a third lane) which corresponds to a third signal set that includes a pair of high speed differential input signals and high speed differential output signals.

The thirteenth PCIe signal ball PS13 corresponds to a fourth set of PCIe high speed differential signals (input, positive). The fourteenth PCIe signal ball PS14 corresponds to a fourth set of PCIe high speed differential signals (input, negative). The thirteenth and fourteenth PCIe signal balls PS13, PS14 constitute a differential pair through which a seventh differential signal flows.

The fifteenth PCIe signal ball PS15 corresponds to a fourth set of PCIe high speed differential signals (output, positive). The sixteenth PCIe signal ball PS16 corresponds to a fourth set of PCIe high speed differential signals (output, negative). The fifteenth and sixteenth PCIe signal balls PS15, PS16 constitute a differential pair through which an eighth differential signal flows.

The four PCIe signal balls PS13, PS14, PS15, PS16 constitute a fourth solder ball set BS4 (that is, a fourth lane) which corresponds to a fourth signal set that includes a pair of high speed differential input signals and high speed differential output signals.

In other words, the semiconductor package 1 according to this embodiment includes four solder ball sets each of which constitutes a lane of PCIe.

The substrate 21 of the semiconductor package 1 has four sides. The four sides are constituted of a first side 41*a*, a second side 41*b*, a third side 41*c*, and a fourth side 41*d*. In a state where the semiconductor package 1 is mounted on the substrate 21, the first side 41*a* of the substrate 21 is positioned closest to the host controller 5. The first side 41*a* constitutes an end portion (that is, an edge portion) which faces the host controller 5 in an opposed manner. The first side 41*a* extends substantially parallel to the host controller 5. The second side 41b is positioned on a side opposite to the first side 41a. The third side 41c and the fourth side 41d extend between the first side 41a and the second side 41b respectively.

In this embodiment, the first to fourth solder ball sets BS1, BS2, BS3, BS4 are collectively arranged close to the first side 41a of the substrate 21. The first to fourth solder ball sets BS1, BS2, BS3, BS4 are positioned between the first side 41a of the substrate 21 and the center portion of the substrate 21. The first to fourth solder ball sets BS1, BS2, BS3, BS4 are arranged substantially parallel to the first side 41a of the substrate 21.

In the arrangement, the first to fourth solder ball sets BS1, BS2, BS3, BS4 are positioned closer to the host controller 5 than the center portion of the substrate 21. That is, the first to fourth solder ball sets BS1, BS2, BS3, BS4 are positioned in a region between a center line C which passes the center of the substrate 21 substantially parallel to the first side 41a and the first side 41a.

Further, in this embodiment, all PCIe signal balls PS1 to PS16 are arranged in one row along a first line L1. The first line L1 is positioned between the first side 41a of the substrate 21 and the center portion of the substrate 21, and extends substantially parallel to the first side 41a of the substrate 21.

As shown in FIG. 10, the plurality of pads 32 on the printed circuit board 4 are arranged corresponding to the arrangement of the plurality of solder balls 27. The plurality of pads 32 on the printed circuit board 4 include sixteen PCIe pads PSP to which the PCIe signal balls PS1 to PS16 are connected. A PCIe signal flows between the PCIe pads PSP and the host controller 5.

The printed circuit board 4 includes sixteen signal lines 6 (wiring pattern) which electrically connect the PCIe pads PSP and the host controller 5 to each other. The signal lines 6 are arranged on a front layer of the printed circuit board 4, for example. The signal lines 6 extend linearly toward the host controller 5 from the PCIe pads PSP. The signal lines 6 extend in the direction substantially orthogonal to the first side 41a of the substrate 21 of the semiconductor package 1. The sixteen signal lines 6 may have the same line length, for example. That is, the isometry of the signal lines 6 is ensured between the host controller 5 and the sixteen PCIe signal balls PS1 to PS16.

Next, the arrangement of the ground balls G is explained. In this embodiment, to simplify the description, "PCIe signal ball" is simply referred to as "solder ball".

Each solder ball set BS1, BS2, BS3, BS4 includes two first solder balls corresponding to a differential input signal and two second solder balls corresponding to a differential output signal respectively. That is, the PCIe signal balls PS1, PS2, PS7, PS8, PS9, PS10, PS13, PS14 correspond to the above-mentioned first solder balls. On the other hand, the PCIe signal balls PS3, PS4, PS5, PS6, PS11, PS12, PS15, PS16 correspond to the above-mentioned second solder balls.

The ground balls G are arranged around the respective PCIe signal balls PS1 to PS16 thus forming an electric shield between some of the PCIe signal balls PS1 to PS16. In this embodiment, the ground ball G is respectively arranged between the solder ball sets BS1, BS2, BS3, BS4, and between the first solder balls and the second solder balls within each solder ball set BS1, BS2, BS3, BS4.

That is, the ground ball G is arranged between the differential pairs. As a result of this arrangement of the ground ball G, an electric shield is formed between the signal balls such that a plurality of differential input signals and a plurality of differential output signals are independent from each other, thus suppressing the mutual interference of signals and the influence of external noises.

Some ground balls G face the PCIe signal balls PS1 to PS16 from a side opposite to the signal lines 6. As a result of this arrangement, an electric shield is formed between the signal balls such that the above-mentioned eight differential signals are independent from each other, thus suppressing the mutual interference of signals and the influence of external noises.

As shown in FIG. 8, the third group G3 of the solder balls 27 includes the plurality of thermal balls T. The third group G3 is positioned further outside the second group G2. The third group G3 is positioned between the second group G2 and an outer peripheral edge of the substrate 21 (four sides 41a, 41b, 41c, 41d). That is, the plurality of thermal balls T are positioned closer to an outer peripheral edge of the substrate 21 than the first to fourth solder ball sets BS1 to BS4 are.

The thermal balls T are arranged in a region between the first side 41a of the substrate 21 and the first to fourth solder ball sets BS1 to BS4 in the direction substantially orthogonal to the first side 41a of the substrate 21 while avoiding regions which extend in direction substantially orthogonal to the first side 41a of the substrate 21 from the first to fourth solder ball sets BS1 to BS4. That is, the thermal balls T are arranged to avoid the regions where the signal lines 6 pass. As a result of this arrangement of the thermal balls T, the signal lines 6 may extend linearly on the front layer of the printed circuit board 4 without being interrupted by the thermal balls T.

When this arrangement is observed from another point of view, the thermal balls T are arranged in regions extending in the direction substantially orthogonal to the first side 41a of the substrate 21 from the ground balls G each of which is positioned between the respective PCIe signal balls PS1 to PS16. The thermal balls T are positioned between the plurality of signal lines 6 and on both sides of the signal line 6. The thermal balls T are electrically connected to the ground layer 29 of the substrate 21, for example, and contribute to the suppression of the mutual interference of signals which are transmitted to the signal lines 6 and the influence of external noises, as electric shields.

As shown in FIG. 7 and FIG. 8, the substrate 21 includes a first region 43a and a second region 43b. The first region 43a overlaps with the controller chip 11 as viewed in a plan view (that is, a projection region of the controller chip 11). On the other hand, the second region 43b is positioned outside the first region 43a.

An arrangement density of the thermal balls T in the second region 43b is higher than an arrangement density of the thermal balls T in the first region 43a. "Arrangement density" is a value obtained by dividing the number of thermal balls T arranged in each region by an area of each region.

As shown in FIG. 10, the pads 32 on the printed circuit board 4 include thermal pads TP to which the thermal balls T are connected. The thermal pads TP are connected to the ground layer or the power supply layer (that is, copper layer) of the printed circuit board 4, for example. The thermal balls T and the thermal pads TP are not limited to thermal balls and thermal pads which are connected to the substrate 21 or to the ground layer or the power supply layer of the printed circuit board 4. The thermal balls T or the thermal pads TP which are not connected to the copper layer may also obtain a heat radiation effect to some extent.

Next, the arrangement of the power supply balls P and the ground balls G is explained.

As shown in FIG. 8, the plurality of power supply balls P and the plurality of ground balls G are arranged in approximately point symmetry with respect to the center of the substrate 21. "Approximately point symmetry" also includes the case where a small number of (one, for example) ground balls G are not arranged in point symmetry, in addition to the case where the power supply balls P and the ground balls G are arranged in complete point symmetry.

In other words, it is sufficient that either the plurality of power supply balls P or the plurality of ground balls G are arranged in approximate point symmetry with respect to the center of the substrate 21. In this embodiment, the plurality of power supply balls P are arranged in point symmetry with respect to the center of the substrate 21.

As shown in FIG. 10, the pads 32 on the printed circuit board 4 include power supply pads PP to which the power supply balls P are connected, and ground pads GP to which the ground balls G are connected.

By arranging the plurality of power supply balls P and the plurality of ground balls G in approximate point symmetry, even when the semiconductor package 1 is mounted on the printed circuit board 4 such that the semiconductor package 1 is erroneously rotated by 180 degrees with respect to the regular direction, the correspondence relationship between the power supply balls P and the power supply pad PP, and the correspondence relationship between the ground balls G and the ground pads GP may be maintained.

According to the above-mentioned embodiment, it is possible to provide the semiconductor package 1 with high speed operability that may be enhanced. However, for example, when the semiconductor package 1 includes only one solder ball set for high speed signals, a high speed operation is limited.

In view of the above, the semiconductor package 1 according to this embodiment includes: the substrate 21; the sealing portion 30; the controller chip 11; the semiconductor chips (semiconductor memory chips 12, for example); and the plurality of differential signal balls (PCIe signal balls PS1 to PS16, for example). At least some of the plurality of differential signal balls are arranged substantially parallel to the first side 41a of the substrate 21.

In the embodiment, an amount of data which may be transmitted or received may be increased by increasing the number of solder ball sets for high speed signals and thus, high speed operability of the semiconductor package 1 may be enhanced.

The plurality of differential signal balls are arranged substantially parallel to the first side 41a of the substrate 21. Accordingly, by arranging semiconductor package 1 such that the first side 41a of the substrate 21 is directed toward the host controller 5, the isometry of the signal lines 6 between the plurality of differential signal balls and the host controller 5 may be easily ensured. Accordingly, quality of signals which the semiconductor package 1 transmits and receives may be enhanced.

The plurality of differential signal balls could be arranged such that differential pairs are arranged in the direction substantially orthogonal to the first side 41a of the substrate 21 so that the plurality of differential signal balls are arranged in two rows substantially parallel to the first side 41a of the substrate 21. In this case, however, when the solder balls 27 are arranged at a pitch of 0.5 mm as in the case of this embodiment, the differential signal balls and the signal lines 6 are arranged densely so that some signal lines 6 are required to be provided with a sharp bent portion. There may be cases where the sharp bent portion influences quality of signals and reliability.

On the other hand, in this embodiment, the plurality of differential signal balls are arranged in a single row substantially parallel to the first side 41a of the substrate 21. In such a configuration, it is difficult that the plurality of differential signal balls and the signal line 6 are arranged densely and hence, it is possible to avoid forming the sharp bent portion on the signal lines 6. Accordingly, quality of signals and reliability may be further enhanced.

In this embodiment, the plurality of ground balls G are arranged around the plurality of differential signal balls thus forming an electric shield between some of the differential signal balls. In such a configuration, the mutual interference of signals of the plurality of differential signal balls and the influence of external noise may be suppressed thus enhancing quality of signals.

In this embodiment, the plurality of solder balls 27 include the plurality of thermal balls T electrically connected to the ground layer 29 or the power supply layer 28 of the substrate 21. In such a configuration, heat from the semiconductor package 1 may be efficiently released to the printed circuit board 4. Accordingly, the rise of temperature of the semiconductor package 1 may be suppressed thus enhancing the high-speed operation of the semiconductor package 1.

In this embodiment, the plurality of thermal balls T are positioned closer to the outer peripheral edge of the substrate 21 than the plurality of solder ball sets BS1 to BS4 are. In such a configuration, the thermal balls T may be arranged by effectively making use of a peripheral portion of the substrate 21 where lines are laid out sparsely. Accordingly, the degree of freedom in layout design of the semiconductor package 1 may be enhanced.

In this embodiment, the plurality of thermal balls T are arranged in a region between the first side 41a of the substrate 21 and the solder ball sets BS1 to BS4 while avoiding regions that extend in the direction substantially orthogonal to the first side 41a of the substrate 21 from the solder ball sets BS1 to BS4. As a result of this arrangement of the thermal balls T, the signal lines 6 may extend linearly from the pads PSP on the printed circuit board 4. That is, it is unnecessary to divert the signal lines 6 around the thermal balls T in order to avoid the thermal balls T. Accordingly, quality of signals may be further enhanced.

From a viewpoint of lowering a cost of the semiconductor package 1, it is desirable not that the thermal balls T are arranged on the entire surface of the substrate 21 in a matted manner but that the required minimum number of thermal balls T are arranged. In setting an upper limit with respect to the number of thermal balls T in this manner, it is preferable to arrange a relatively large number of thermal balls T in the second region 43b of the substrate 21 also from a viewpoint of enhancing heat radiation property.

The plurality of thermal balls T may be arranged in the first region 43a in a concentrated manner. It appears that when a relatively large number of thermal balls T are arranged in the first region 43a positioned directly below the controller chip 11 which is a heat generating part, a favorable heat radiation property may be obtained.

However, according to the result of a test carried out by inventors of the present disclosure, it is found that the rise of temperature of the semiconductor package 1 may be suppressed to a low level when a relatively large number of thermal balls T are arranged in the second region 43b, as compared to the first region 43a. The reason is that when the thermal balls T are arranged in a divided manner so that the thermal balls T are arranged in the second region 43b in addition to the first region 43a, a heat radiation property of the entire semiconductor package 1 is increased. In view of this recognition, in this embodiment, a relatively large number of thermal balls T are arranged in the second region 43b, as compared to the first region 43a thus further increasing a heat radiation property of the semiconductor package 1.

In this embodiment, the plurality of solder balls 27 include the plurality of power supply balls P electrically connected to the power supply layer 28 of the substrate 21 and the plurality of ground balls G electrically connected to the ground layer 29 of the substrate 21. The plurality of power supply balls P and the plurality of ground balls G are arranged in approximate point symmetry with respect to the center of the substrate 21.

In the case where the plurality of power supply balls P and the plurality of ground balls G are not arranged in approximate point symmetry, when the semiconductor package 1 is mounted on the substrate 21 such that the semiconductor package 1 is erroneously rotated by 180 degrees with respect to the regular direction, there is a possibility that the power supply pads PP on the printed circuit board 4 and the ground balls G of the semiconductor package 1 are connected to each other, thus causing short-circuiting.

In this embodiment, to the contrary, the plurality of power supply balls P and the plurality of ground balls G are arranged in approximate point symmetry with respect to the center of the substrate 21. Accordingly, even when the semiconductor package 1 is mounted on the substrate 21 such that the semiconductor package 1 is erroneously rotated by 180 degrees with respect to the regular direction, the correspondence relationship between the plurality of power supply balls P and the plurality of power supply pads PP, and the correspondence relationship between the plurality of ground balls G and the plurality of ground pads GP are maintained. Accordingly, there is no possibility of short-circuiting so that a damage on the whole system and the semiconductor package 1 may be prevented.

Second Embodiment

Next, a semiconductor package 1 according to the second embodiment is explained with reference to FIG. 11 to FIG. 16. The elements in the second embodiment having identical or similar functions with the corresponding elements of the first embodiment are given same symbols, and the repeated explanation of the elements is omitted. Further, elements in the second embodiment other than the elements explained hereinafter are the same as the corresponding elements of the first embodiment.

Figure 11:
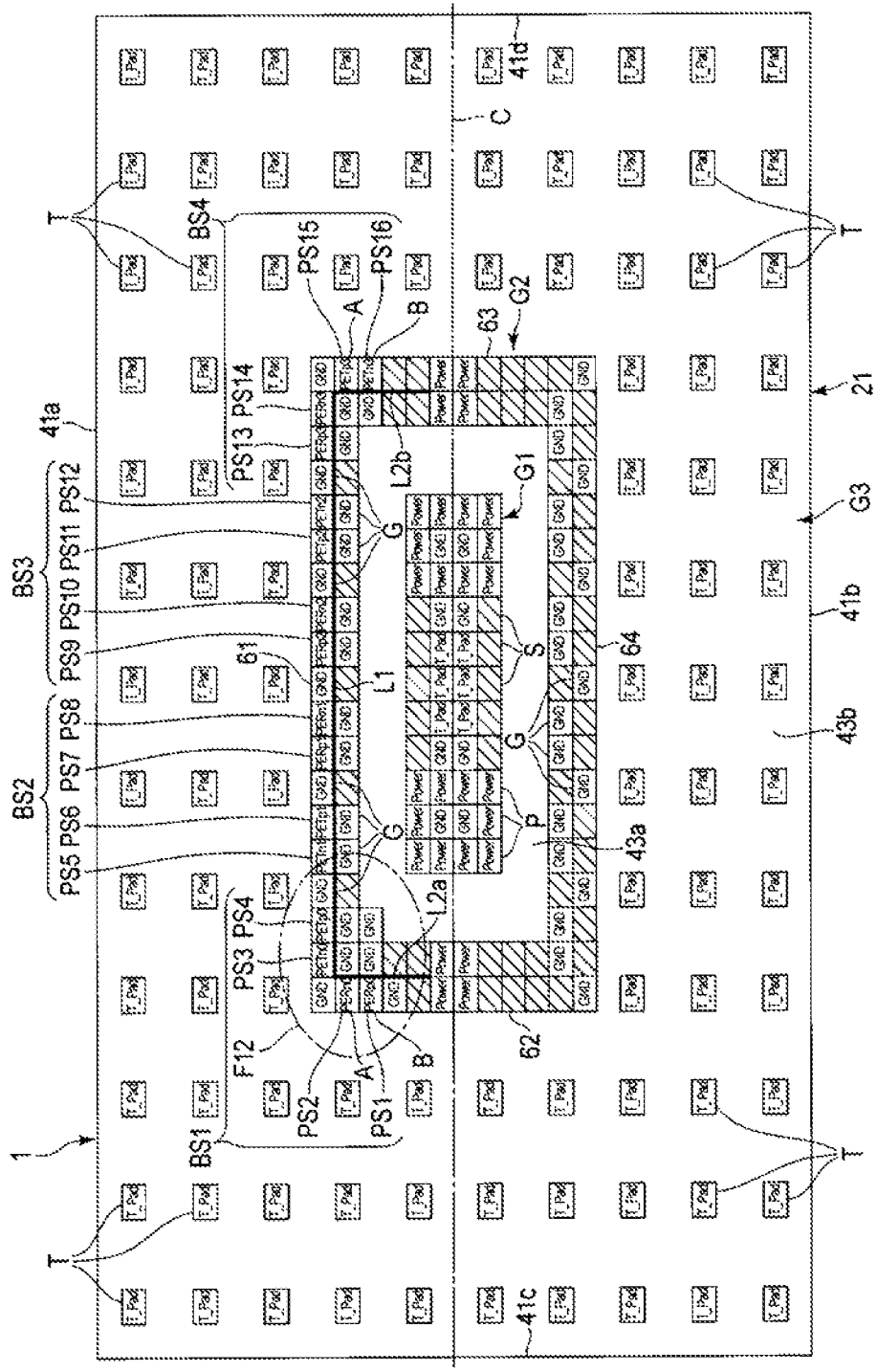
FIG. 11 is a view illustrating the assignment of solder balls of a semiconductor package according to a second embodiment.
Figure 12:
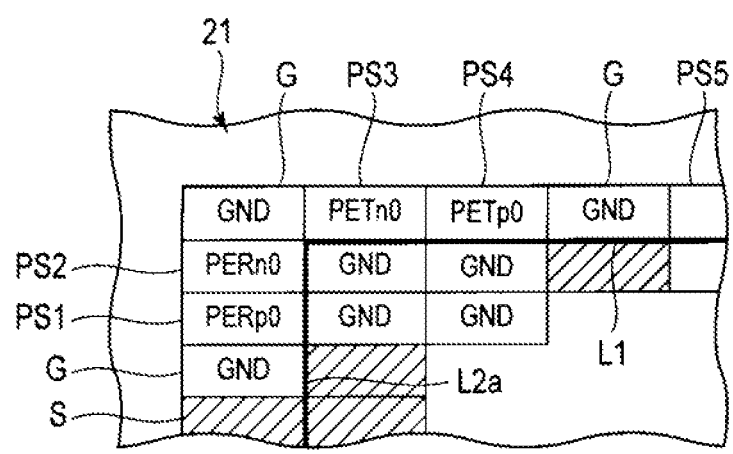
FIG. 12 is a view illustrating a region of the semiconductor package shown in FIG. 11 in an enlarged manner.

FIG. 11 shows the assignment of solder balls 27 according to this embodiment. FIG. 12 shows a portion enclosed by oval F12 in FIG. 11 in an enlarged manner. As shown in FIG. 11 and FIG. 12, in this embodiment, a plurality of PCIe signal balls PS1 to PS16 are arranged along a first line L1 and a pair of second lines L2a, L2b. The first line L1 is positioned between a first side 41a of a substrate 21 and a center portion of the substrate 21, and is arranged substantially parallel to the first side 41a of the substrate 21. The pair of second lines L2a, L2b extends from both end portions of the first line L1 in the direction away from the first side 41a of the substrate 21.

That is, some PCIe signal balls PS1, PS2, PS15, PS16 which are positioned on the outermost sides among the plurality of PCIe signal balls PS1 to PS16 are arranged so that directions of the PCIe signal balls PS1, PS2, PS15, PS16 are changed to be along the second lines L2a, L2b which intersect with (substantially orthogonal to, for example) the first line L1. The pair of second lines L2a, L2b also may be hereinafter referred to as a second line L2a and a third line L2b, for example.

In this embodiment, the PCIe signal balls PS5 to PS12 of the second and third ball sets BS2, BS3 are arranged in one row along the first line L1. On the other hand, the PCIe signal balls PS1 to PS4, PS12 to PS16 of the first and fourth ball set BS1, BS4 are positioned on both sides of the second and third ball sets BS2, BS3 and, at the same time, at least a portion of the PCIe signal balls PS1 to PS4 of the first ball set BS1 and a portion of the PCIe signal balls PS12 to PS16 of the fourth ball set BS4 are arranged along the pair of second lines L2a, L2b respectively.

Also in this embodiment, all PCIe signal balls PS1 to PS16 of the first to fourth solder ball sets BS1, BS2, BS3, BS4 are positioned in a region between a center line C which passes the center of the substrate 21 substantially parallel to the first side 41a, and the first side 41a.

Specifically, a second group G2 arranged in a frame shape includes a first portion 61 (first side), a second portion 62 (second side), a third portion 63 (third side), and a fourth portion 64 (fourth side). The first portion 61 is arranged along the first line L1. The second portion 62 is arranged in the direction substantially orthogonal to the first portion 61 from a first end portion of the first portion 61.

The third portion 63 is arranged in the direction substantially orthogonal to the first portion 61 from a second end portion of the first portion 61 positioned on a side opposite to the first end portion. The second portion 62 and the third portion 63 are positioned on both sides of the first group G1 in a separated manner. The fourth portion 64 is arranged substantially parallel to the first portion 61. The fourth portion 64 extends between the second portion 62 and the third portion 63. The first portion 61 and the fourth portion 64 are positioned on both sides of the first group G1 in a separated manner.

In this embodiment, the PCIe signal balls PS5 to PS12 of the second and third ball sets BS2, BS3 are positioned in the first portion 61 and are arranged in one row. Two PCIe signal balls PS3, PS4 of the first ball set BS1 are arranged in the first portion 61. Two PCIe signal balls PS12, PS13 of the third ball set BS4 are arranged in the first portion 61.

On the other hand, two PCIe signal balls PS1, PS2 of the first ball set BS1 are arranged at an end portion of the second portion 62 which is connected to the first portion 61. In the same manner, two PCIe signal balls PS15, PS16 of the fourth ball set BS4 are arranged at an end portion of the third portion 63 which is connected to the first portion 61.

In this configuration, the plurality of PCIe signal balls PS1 to PS16 include a plurality of first differential pairs which are arranged along the first line L1, and second differential pairs which are arranged along the pair of second lines L2a, L2b. That is, the PCIe signal balls (PS3, PS4), (PS5, PS6), (PS7, PS8), (PS9, PS10), (PS11, PS12), (PS13, PS14) respectively constitute one example of a first differential pair. On the other hand, the PCIe signal balls (PS1, PS2), (PS15, PS16) respectively constitute one example of a second differential pair.

In this embodiment, the respective second differential pairs include a first ball A and a second ball B. The second ball B is positioned away from the first side 41a of the substrate 21, as compared to the first ball A. In this embodiment, the PCIe signal balls PS2, PS15 constitute one example of the first ball A. The PCIe signal balls PS1, PS16 constitute one example of the second ball B.

Figure 13:
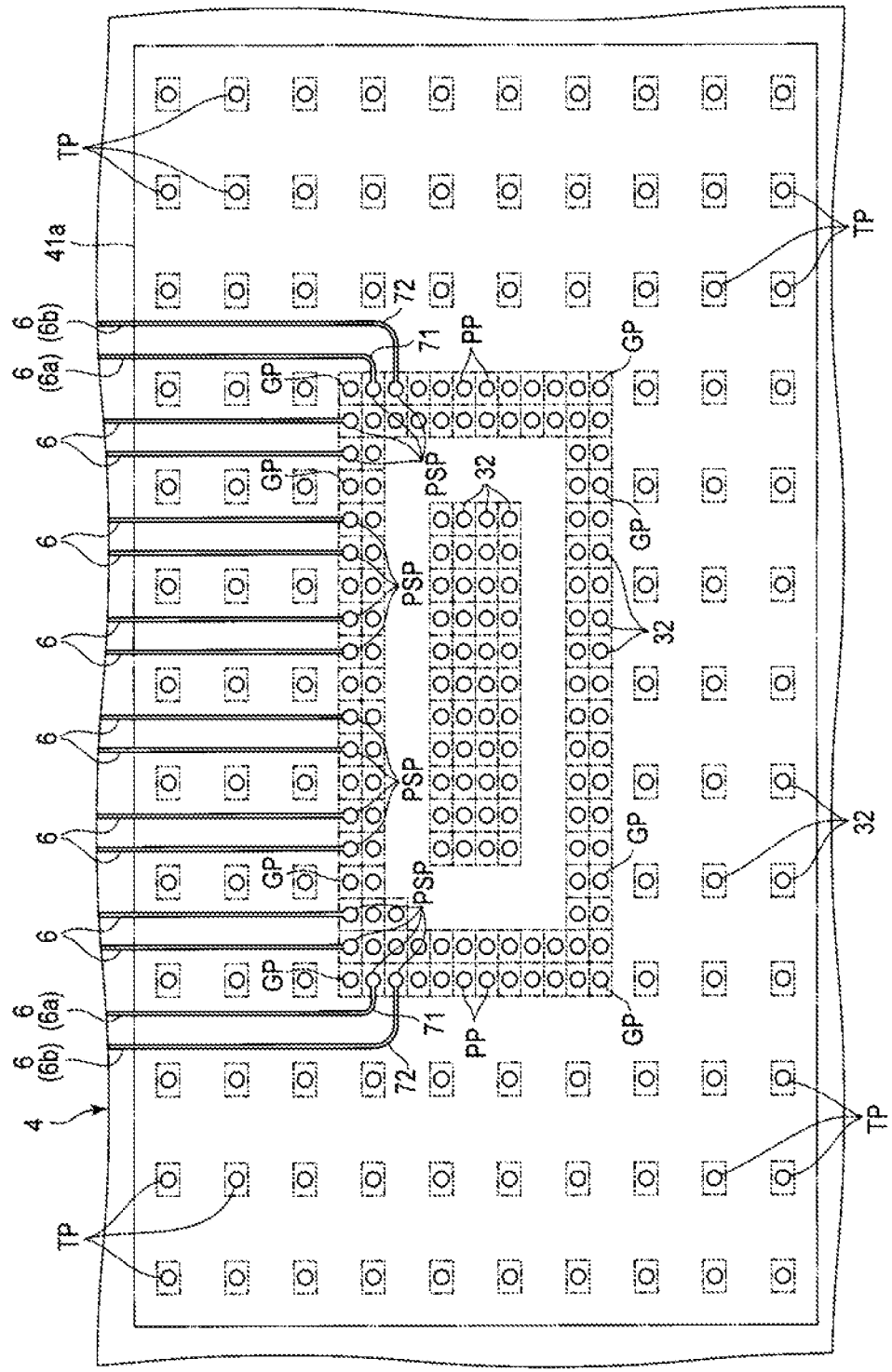
FIG. 13 is a plan view illustrating pads of a printed circuit board according to the second embodiment.

FIG. 13 shows the arrangement of pads 32 on a printed circuit board 4 according to this embodiment. As shown in FIG. 13, the signal lines 6 include four signal lines 6a, 6b which extend between the PCIe signal balls (PS1, PS2), (PS15, PS16) which constitute the second differential pairs and a host controller 5. The four signal lines 6a, 6b extend substantially parallel to the first side 41a of the substrate 21 from the PCIe pads PSP, have a curved portion which is bent in a curved shape, and extend in the direction substantially orthogonal to the first side 41a of the substrate toward the host controller 5.

Specifically, the signal lines 6 include the first signal lines 6a extending between the first balls A and the host controller 5, and the second signal lines 6b extending between the second balls B and the host controller 5. The first signal lines 6a include a first curved portion 71. The second signal lines 6b include a second curved portion 72 which has a larger radius of curvature than the first curved portion 71 and which is positioned outside the first curved portions 71, for example. The first and second curved portions 71, 72 are formed in a quarter arc shape, for example.

In this embodiment, all solder balls 27 including a plurality of ground balls G and a plurality of thermal balls T are arranged in regions where the first and second signal lines 6a, 6b having the curved portions 71, 72 respectively are not arranged.

Figure 14:
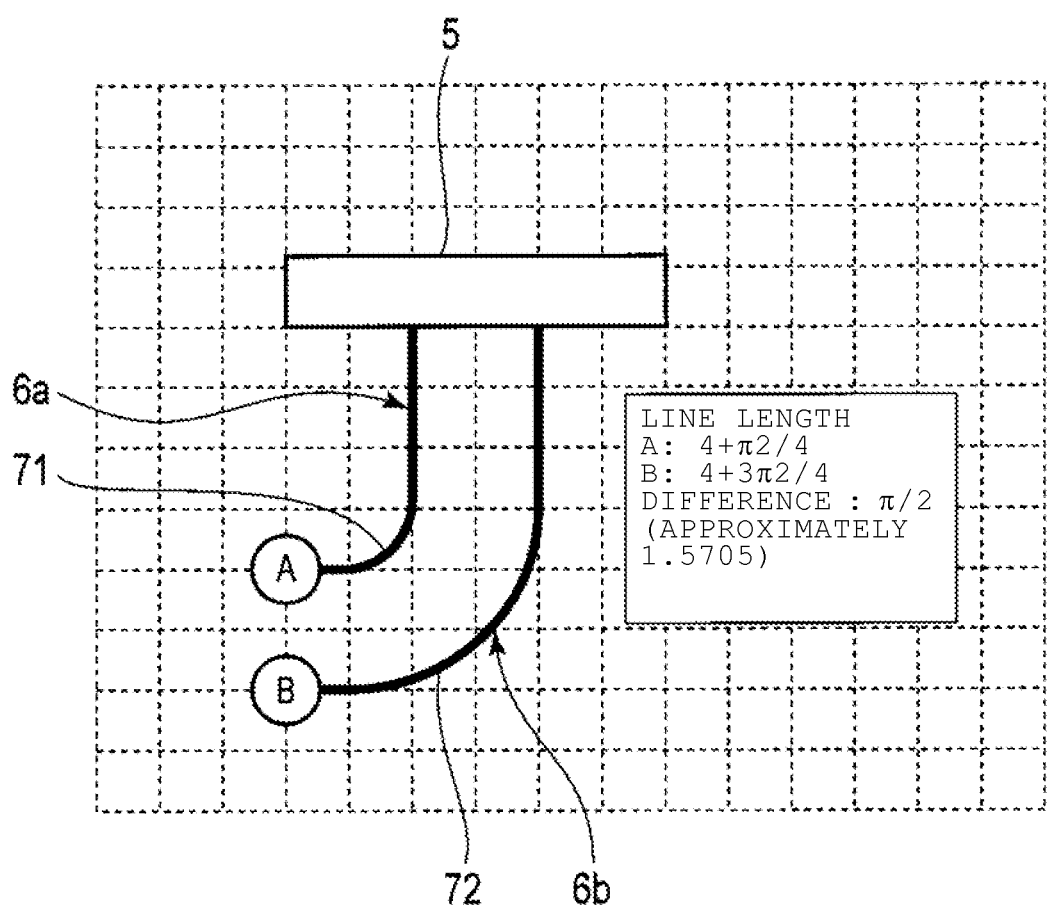
FIG. 14 is a view schematically illustrating a part of signal lines shown in FIG. 13.

FIG. 14 schematically shows line lengths of signal lines 6 between the first and second balls A, B which constitute a second differential pair and the host controller 5. To simplify the description, in the drawing, portions of the signal lines 6 which exert the same influence on the line length between the first ball A and the second ball B are shown with a reduced distance.

As shown in FIG. 14, in this embodiment, when a distance between the first ball A and the second ball B is 2, the difference in line length between the first signal line 6a and the second signal line 6b is $\pi/2$ (approximately 1.5705).

Next, a first modification of the signal lines 6 is explained with reference to FIG. 15. The elements of the first modification having identical or similar functions with the corresponding elements of the above-mentioned embodiment are given same symbols, and the repeated explanation of the elements is omitted.

The signal lines 6 include four signal lines 6a, 6b which extend between PCIe signal balls (PS1, PS2), (PS15, PS16) which constitute second differential pairs and the host controller 5. The four signal lines 6a, 6b extend substantially parallel to the first side 41a of the substrate 21 from PCIe pads PSP, respectively include a portion which extends obliquely with respect to the first side 41a of the substrate 21, and extend in the direction substantially orthogonal to the first side 41a of the substrate toward the host controller 5.

Specifically, the first signal line 6a includes a first angled portion 73 which extends obliquely with respect to the first side 41a of the substrate 21. The second signal line 6b includes a second angled portion 74 which is arranged substantially parallel to the first angled portion 73, and is positioned outside the first angled portion 73, for example. The first and second angled portions 73, 74 have an angle of 45° with respect to the first side 41a of the substrate 21, for example.

In this embodiment, all solder balls 27 including a plurality of ground balls G and a plurality of thermal balls T are arranged in regions where the first and second signal lines 6a, 6b having the angled portions 73, 74 respectively are not arranged.

Figure 15:
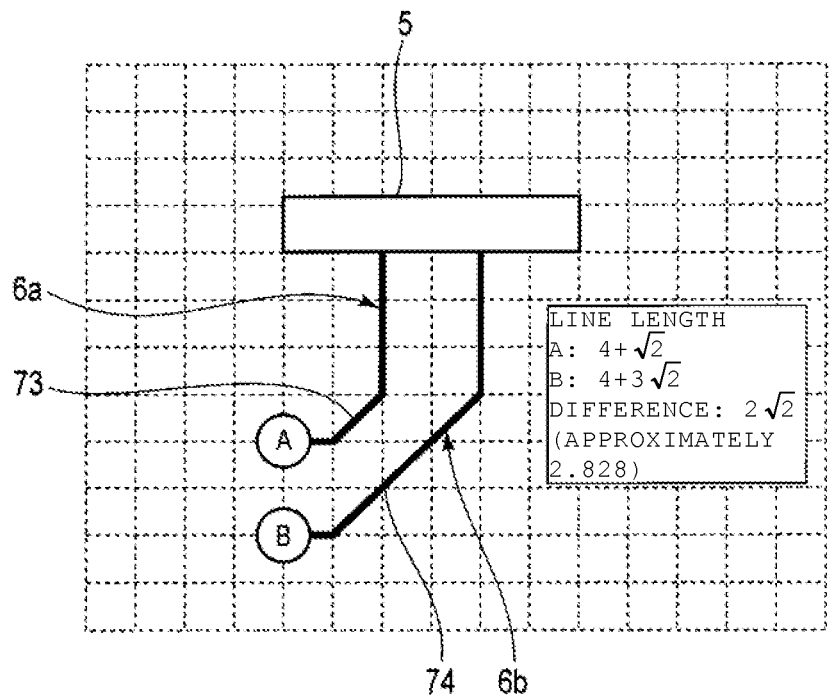
FIG. 15 is a view schematically illustrating a first modification of the signal lines shown in FIG. 13.

FIG. 15 schematically shows line lengths of the signal lines 6 of this modification between the first and second balls A, B which constitute a second differential pair and the host controller 5. To simplify the description, in the drawing, portions of the signal lines 6 which exert the same influence on the line length between the first ball A and the second ball B are shown with a reduced distance.

As shown in FIG. 15, in this embodiment, when a distance between the first ball A and the second ball B is 2, a difference in line length between the first signal line 6a and the second signal line 6b is $2\sqrt{2}$ (approximately 2.828).

Next, a second modification of the signal lines 6 is explained with reference to FIG. 16. The elements of the second modification having identical or similar functions with the corresponding elements of the above-mentioned embodiment are given same symbols, and the repeated explanation of the elements is omitted.

The signal lines 6 include four signal lines 6a, 6b which extend between PCIe signal balls (PS1, PS2), (PS15, PS16) which constitute second differential pairs and a host controller 5. The four signal lines 6a, 6b extend substantially parallel to a first side 41a of a substrate 21 from PCIe pads PSP, are bent at an approximately right angle, and extend in the direction substantially orthogonal to the first side 41a of the substrate 21 toward the host controller 5. All solder balls 27 including a plurality of ground balls G and a plurality of thermal balls T are arranged in regions where the first and second signal lines 6a, 6b are not arranged.

Figure 16:
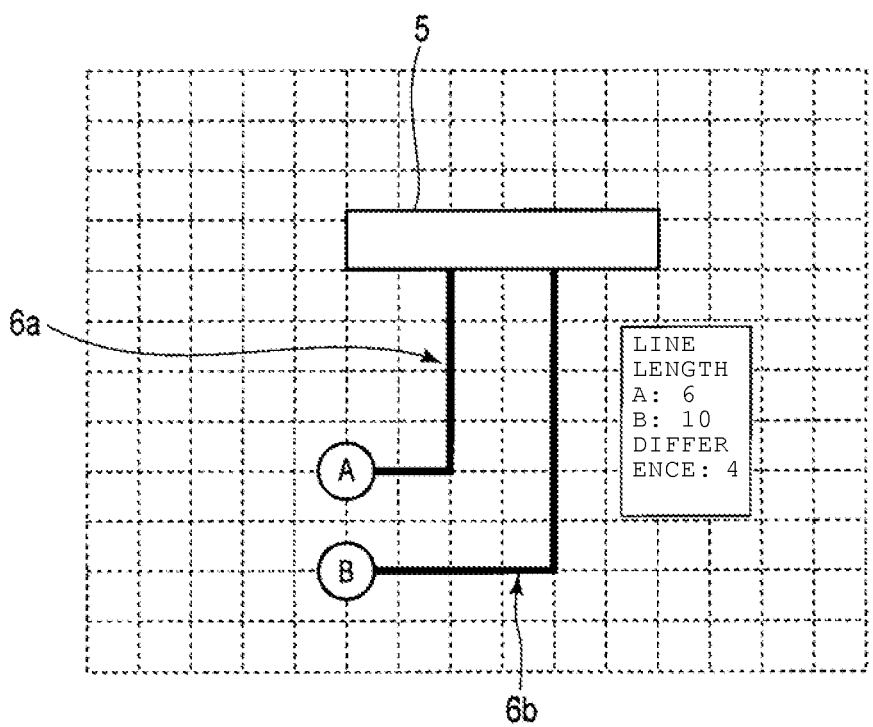
FIG. 16 is a view schematically illustrating a second modification of the signal lines shown in FIG. 13.

FIG. 16 schematically shows line lengths of the signal lines 6 of this modification between the first and second balls A, B which constitute the second differential pair and the host controller 5. To simplify the description, in the drawing, portions of the signal lines 6 which exert the same influence on the line length between the first ball A and the second ball B are shown with a reduced distance.

As shown in FIG. 16, in this embodiment, when a distance between the first ball A and the second ball B is 2, a difference in line length between the first signal line 6a and the second signal line 6b is 4.

According to the configuration of the second embodiment and the modifications of the second embodiment explained heretofore, in the same manner as the first embodiment, it is possible to provide the semiconductor package 1 with high speed operability that may be enhanced and, further, with connection reliability of the differential signal balls that may be enhanced.

In general, a peripheral end portion of the substrate 21 is a region where the connection reliability of the solder balls 27 may be lowered due to a thermal stress upon mounting the semiconductor package 1, for example. Accordingly, when the differential signal balls are arranged close to the peripheral end portion of the substrate 21, the connection reliability of the differential signal balls may be lowered.

In view of the above, in this embodiment, the plurality of differential signal balls (PCIe signal balls PS1 to PS16, for example) are arranged along the first line L1 substantially parallel to the first side 41a of the substrate 21 and along the pair of second lines L2a, L2b which extend from both end portions of the first line L1 in the direction away from the first side 41a of the substrate 21.

In the embodiment, for example, all differential signal balls may be arranged away from the peripheral end portion of the substrate 21, as compared to the structure of the first embodiment. Accordingly, the connection reliability of the differential signal balls may be enhanced.

In this embodiment, the plurality of differential signal balls include the plurality of first differential pairs arranged along the first line L1, and the second differential pairs arranged along the pair of second lines L2a, L2b. In such a configuration, the isometry of the signal lines 6a, 6b of the second differential pairs may be easily ensured. Accordingly, quality of signals which the differential signal balls arranged along the second lines L2a, L2b transmit and receive may be enhanced.

In this embodiment, first and second signal lines 6a, 6b extend substantially parallel to the first side 41a of the substrate 21 from the PCIe pads PSP, have the curved portions 71, 72, and extend toward the host controller 5. In such a configuration, for example, a difference in line length between the first and second signal lines 6a, 6b may be small, as compared to the structure of the second modification of this embodiment. Accordingly, quality of signals which the differential pairs arranged along the second lines L2a, L2b transmit and receive may be enhanced.

In the same manner, first and second signal lines 6a, 6b according to the first modification of this embodiment extend substantially parallel to the first side 41a of the substrate 21 from PCIe pads PSP, have the angled portions 73, 74, and extend toward the host controller 5. In such a configuration, for example, a difference in line length between the first and second signal lines 6a, 6b may be small, as compared to the structure of the second modification. Accordingly, quality of signals which the differential pairs arranged along the second lines L2a, L2b transmit and receive may be enhanced.

Third Embodiment

Next, a semiconductor package 1 according to the third embodiment is explained with reference to FIG. 17 to FIG. 19. The elements having identical or similar functions with the elements of the first and second embodiments are given same symbols, and the repeated explanation of the elements is omitted. Further, elements in the third embodiment other than the elements explained hereinafter are the same as the corresponding elements of the second embodiment.

Figure 17:
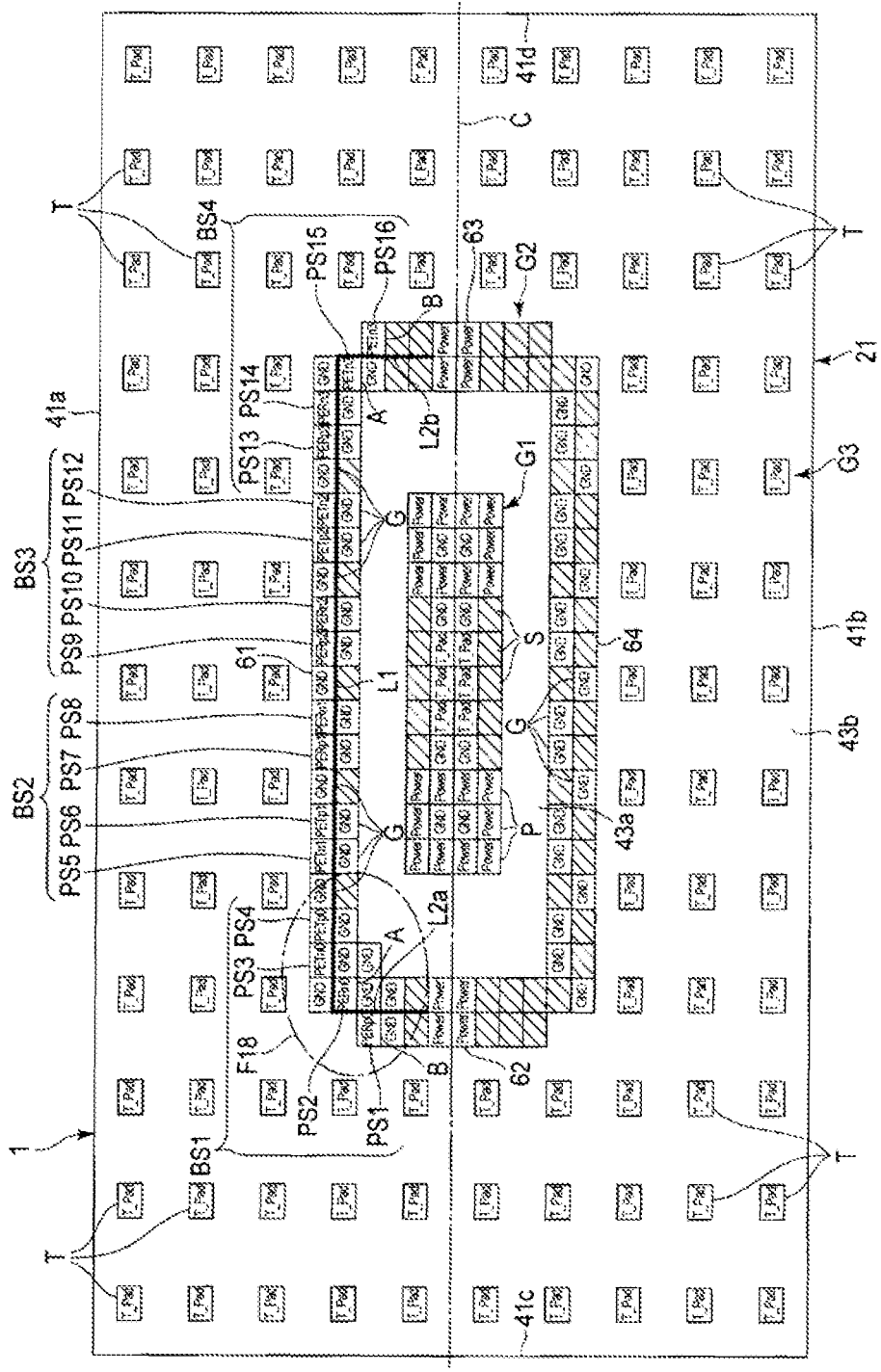
FIG. 17 is a view illustrating the assignment of solder balls of a semiconductor package according to a third embodiment.
Figure 18:
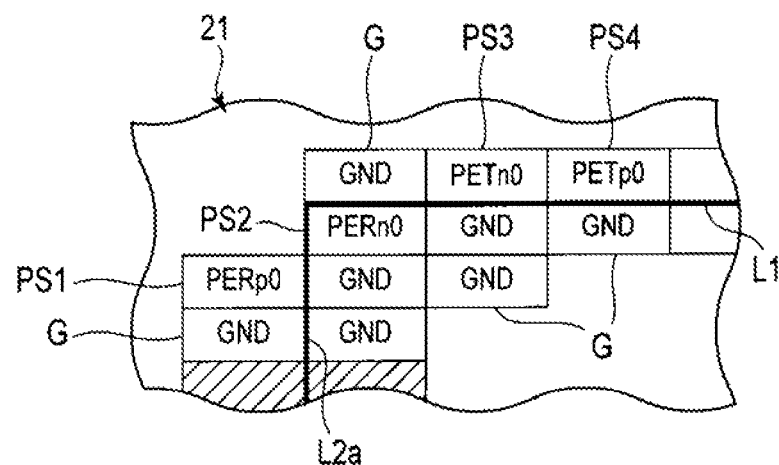
FIG. 18 is a view illustrating a region of the semiconductor package shown in FIG. 17 in an enlarged manner.

FIG. 17 shows the assignment of solder balls 27 according to this embodiment. FIG. 18 shows a portion enclosed by an oval F18 in FIG. 17 in an enlarged manner. FIG. 19 shows the arrangement of pads 32 according to this embodiment.

In this embodiment, in the same manner as the second embodiment, PCIe signal balls (PS1, PS2), (PS15, PS16) which constitute second differential pairs respectively include a first ball A and a second ball B which is positioned away from a first side 41a of a substrate 21, as compared to the first ball A.

In this embodiment, the first ball A is arranged in a displaced manner toward the inside (a center side) of the substrate 21 with respect to the second ball B in the direction substantially parallel to the first side 41a of the substrate 21, for example. "The first ball A is arranged in a displaced manner toward the inside (a center side) of the substrate with respect to the second ball" means that the first ball A is arranged in a displaced manner toward the center portion of a first portion 61 in a second group G2 with respect to the second ball B. In other words, "The first ball A is arranged in a displaced manner toward the inside (a center side) of the substrate with respect to the second ball" means that the first ball A is arranged in a displaced manner toward the center portion of the first side 41a of the substrate 21 with respect to the second ball B.

Put another way, when the solder balls 27 are arranged in a frame shape in two rows (in a double frame shape) in the second group G2, the second ball B is positioned in an outer frame and the first ball A is positioned in an inner frame.

Figure 19:
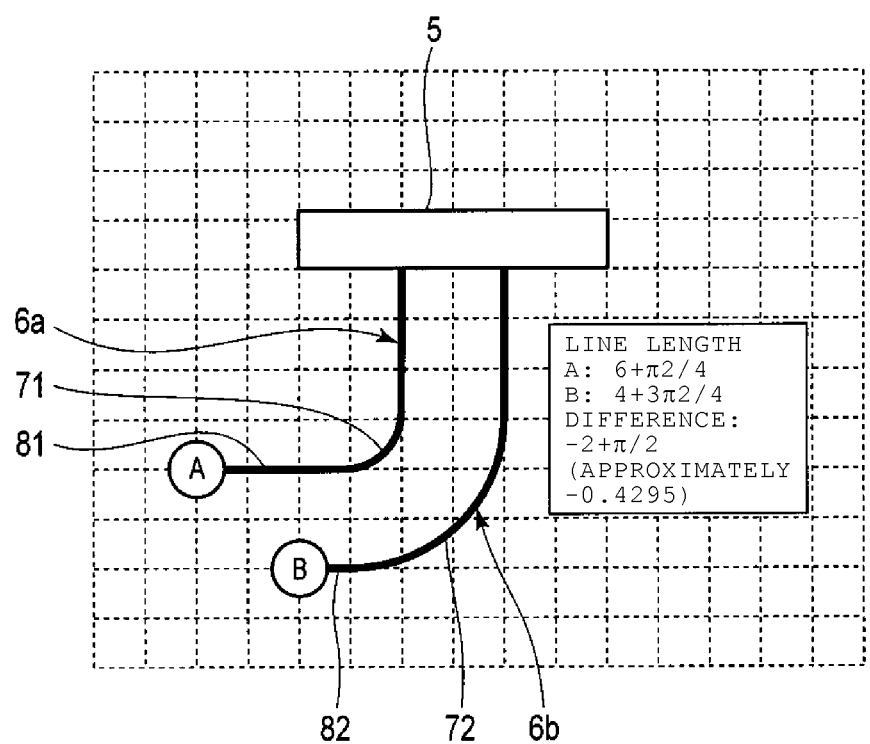
FIG. 19 is a view schematically illustrating a part of signal lines according to the third embodiment.

As shown in FIG. 19, a first signal line 6a includes a first linear portion 81 between the first ball A and a first curved portion 71. The first linear portion 81 extends substantially parallel to the first side 41a of the substrate 21. A second signal line 6b includes a second linear portion 82 between the second ball B and a second curved portion 72. The second linear portion 82 extends substantially parallel to the first side 41a of the substrate 21. The first linear portion 81 is longer than the second linear portion 82.

As shown in FIG. 19, when a distance between the first ball A and the second ball B are set is 2, when the first ball A is arranged in a displaced manner toward the inside of the substrate 21 by a distance 2 with respect to the second ball B, a difference in line length between the first signal line 6a and the second signal line 6b is $-2+\pi/2$ (approximately -0.4295).

In the embodiment, in the same manner as the first embodiment, it is possible to provide the semiconductor package 1 with high speed operability that may be enhanced. Further, in the embodiment, in the same manner as the above-mentioned second embodiment, all differential signal balls may be arranged away from the peripheral end portion of the substrate 21 and hence, the connection reliability of the differential signal balls may be enhanced.

In this embodiment, the first ball A is arranged in a displaced manner toward the inside (the center side) of the substrate 21 with respect to the second ball B. In such a configuration, the isometry of the first and second signal lines 6a, 6b may be easily ensured, as compared to the structure of the second embodiment, for example. Accordingly, quality of signals which the differential pairs arranged along the second lines L2a, L2b transmit and receive may be enhanced.

Fourth Embodiment

Figure 21:
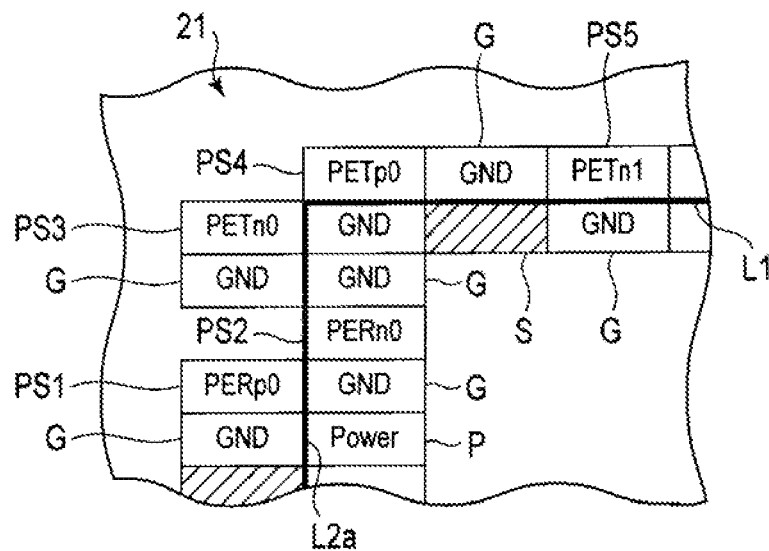
FIG. 21 is a view illustrating a region of the semiconductor package shown in FIG. 20 in an enlarged manner.
Figure 22:
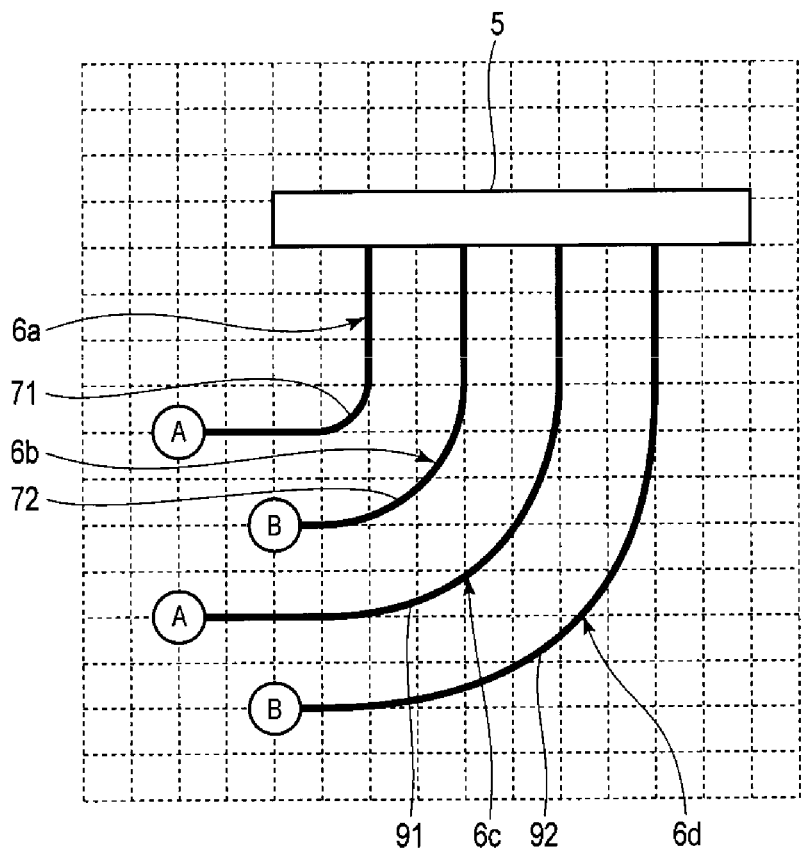
FIG. 22 is a view schematically illustrating a part of signal lines according to the fourth embodiment.

Next, a semiconductor package 1 according to the fourth embodiment is explained with reference to FIG. 20 to FIG. 22. The elements in the fourth embodiment having identical or similar functions with the corresponding elements of the first to third embodiments are given same symbols, and the repeated explanation of the parts is omitted. Further, elements in the fourth embodiment other than the elements explained hereinafter are the same as the corresponding elements of the third embodiment.

Figure 20:
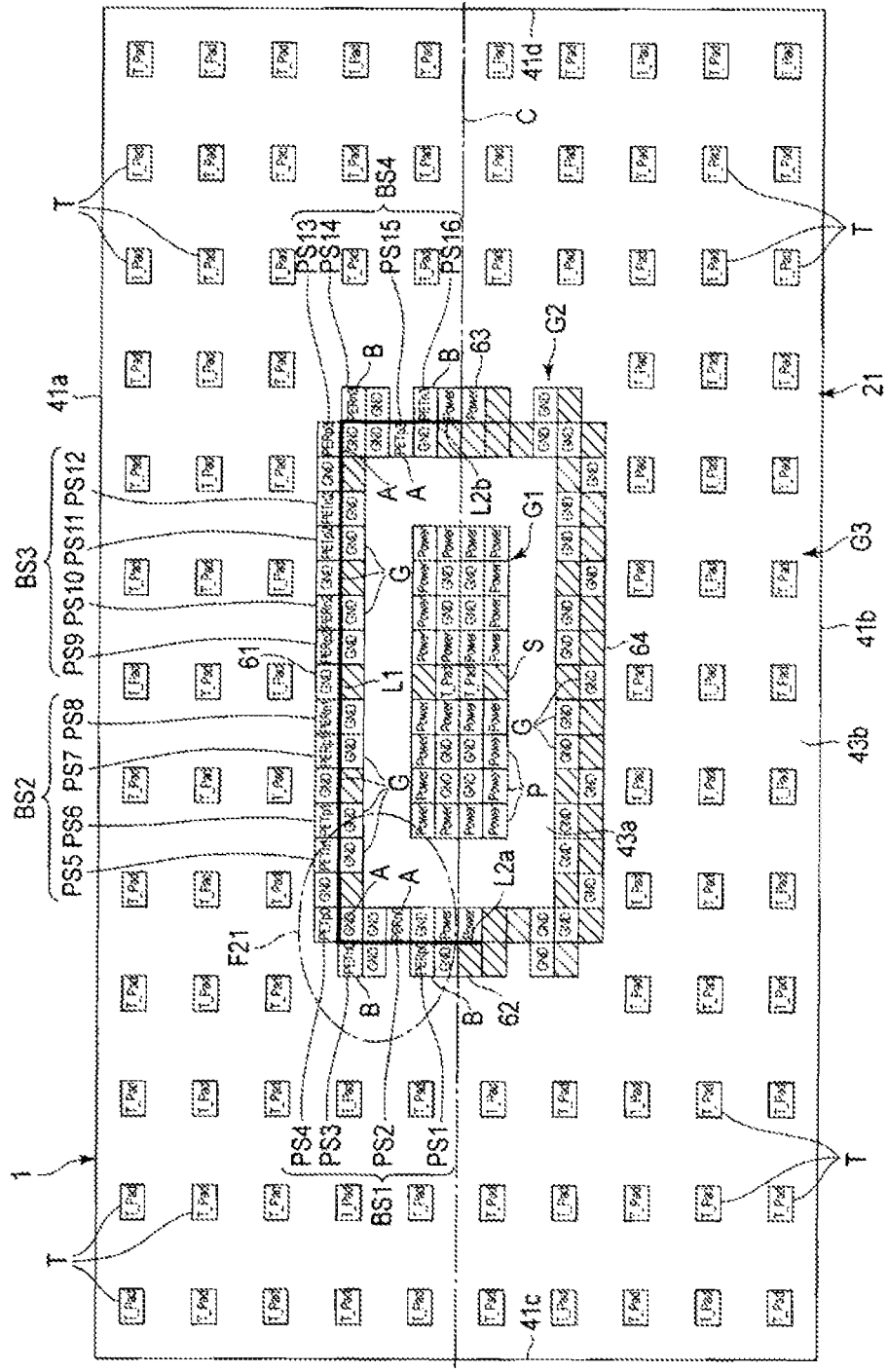
FIG. 20 is a view illustrating the assignment of solder balls of a semiconductor package according to a fourth embodiment.

FIG. 20 shows the assignment of solder balls 27 according to this embodiment. FIG. 21 shows a portion enclosed by oval F21 in FIG. 20 in an enlarged manner. FIG. 21 shows the arrangement of pads 32 according to this embodiment.

In this embodiment, a plurality of PCIe signal balls PS1 to PS16 include a plurality of first differential pairs arranged along a first line L1, and a plurality of second differential pairs arranged along a pair of second lines L2a, L2b respectively. That is, in this embodiment, a first plurality of second differential pairs are arranged along second line L2a, and a second plurality of second differential pairs are arranged along second line L2b.

Specifically, two differential pairs (PS1, PS2), (PS3, PS4) of a first solder ball set BS1 are arranged along one second line L2a. Two differential pairs (PS13, PS14), (PS15, PS16) of a fourth solder ball set BS4 are arranged along the other second line L2b.

In this embodiment, signal lines 6 for the differential pairs arranged along one second line L2a are explained. The differential pairs arranged along the other second line L2b have the substantially same constitution as the differential pairs arranged along one second line L2a.

The signal line 6 includes a first signal line 6a and a second signal line 6b corresponding to one differential pair (PS3, PS4), and a third signal line 6c and a fourth signal line 6d corresponding to the other differential pair (PS1, PS2).

The first signal line 6a extends between a first ball A of one differential pair (PS3, PS4) and a host controller 5. The second signal line 6b extends between a second ball B of the same differential pair (PS3, PS4) and the host controller 5.

The third signal line 6c extends between a first ball A of the other differential pair (PS1, PS2) and the host controller 5.

The fourth signal line 6d extends between a second ball B of the same differential pair (PS1, PS2) and the host controller 5.

The first signal line 6a includes a first curved portion 71. The second signal line 6b includes a second curved portion 72 which has a larger radius of curvature than the first curved portion 71, and is positioned outside the first curved portion 71, for example. The third signal line 6c includes a third curved portion 91 positioned outside the second curved portion 72. Although the third curved portion 91 may have a larger radius of curvature than the second curved portion 72, it is not necessary for the third curved portion 91 to have a larger radius of curvature than the second curved portion 72. The fourth signal line 6d includes a fourth curved portion 92 which has a larger radius of curvature than the third curved portion 91 and is positioned outside the third curved portion 91, for example.

In the embodiment, in the same manner as the first embodiment, it is possible to provide the semiconductor package 1 with high speed operability that may be enhanced.

In this embodiment, the plurality of differential signal balls include the plurality of first differential pairs arranged along the first line L1 and the plurality of second differential pairs arranged along second lines L2a, L2b. In such a configuration, for example, all differential signal balls may be arranged further away from the peripheral end portion of the substrate 21, as compared to the structure of the second embodiment. Accordingly, the connection reliability of the differential signal balls may be further enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, third and fourth signal lines 6c, 6d of a semiconductor package 1 according to the third embodiment may adopt a shape of a signal line of the first and second modifications of the second embodiment.

What is claimed is:

1. A semiconductor device comprising:
   a substrate having a first surface and a second surface positioned on a side opposite to the first surface;
   a sealing portion formed on the first surface of the substrate;
   a controller covered with the sealing portion;
   a semiconductor chip electrically connected to the controller and covered with the sealing portion;
   a ground ball formed on the second surface of the substrate; and
   a plurality of differential signal balls formed on the second surface of the substrate, wherein
   at least some of the plurality of differential signal balls are arranged substantially parallel to one side of the substrate, and
   the ground ball is positioned between two adjacent differential signal balls.

2. The semiconductor device according to claim 1, wherein the plurality of differential signal balls is arranged along a first line substantially parallel to the one side of the substrate and along a pair of second lines extending from both end portions of the first line in a direction away from the one side of the substrate.

3. The semiconductor device according to claim 2, wherein a high speed signal which conforms to a standard of PCI Express is transmitted through the plurality of differential signal balls.

4. The semiconductor device according to claim 2, wherein the plurality of differential signal balls includes a plurality of first differential pairs arranged along the first line, and a plurality of second differential pairs arranged along the second lines.

5. The semiconductor device according to claim 4, wherein the second differential pair includes a first ball and a second ball that is positioned farther away from the one side of the substrate than the first ball, and
   the first ball is arranged in a displaced manner toward a center of the substrate with respect to the second ball.

6. The semiconductor device according to claim 2, wherein the plurality of differential signal balls includes a plurality of first differential pairs arranged along the first line, and a plurality of second differential pairs arranged along each of the second lines, and
   the plurality of second differential pairs respectively includes a first ball and a second ball that is positioned further away from the one side of the substrate than the first ball, and
   the first ball is arranged in a displaced manner toward a center of the substrate with respect to the second ball.

7. The semiconductor device according to claim 1, further comprising:
   a plurality of heat radiation balls formed on the second surface of the substrate and electrically connected to a ground layer or a power supply layer of the substrate.

8. The semiconductor device according to claim 7, wherein the plurality of heat radiation balls is arranged to avoid a region which overlaps with signal lines electrically connected to the differential signal balls.

9. A semiconductor package mounted on a printed circuit board including a host controller, the semiconductor package comprising:
   a package substrate having a first surface and a second surface positioned on a side opposite to the first surface;
   a sealing portion formed on the first surface of the substrate;
   a controller covered with the sealing portion;
   a semiconductor chip electrically connected to the controller and covered with the sealing portion;
   a plurality of differential signal balls formed on the second surface of the substrate, at least some of the plurality of differential signal balls are arranged substantially parallel to one side of the substrate; and
   a plurality of heat radiation balls that are arranged to avoid a region which overlaps with signal lines formed on the printed circuit board and electrically connecting the differential signal balls to the host controller.

10. The semiconductor device according to claim 9, wherein the signal lines include first signal lines that extend in a direction perpendicular to the one side of the substrate, and second signal lines each having a first portion that extend in a direction parallel to the one side of the substrate, a second portion that extend in the direction perpendicular to the one side of the substrate, and a connecting portion between the first and second portions.

11. The semiconductor device according to claim 10, wherein the connecting portion is curved.

12. The semiconductor device according to claim 10, wherein the connecting portion is linear and forms an angle of 45 degrees with respect to the one side of the substrate.

* * * * *